(12) United States Patent
Yamana et al.

(10) Patent No.: US 9,006,769 B2
(45) Date of Patent: Apr. 14, 2015

(54) ORGANIC ELECTROLUMINESCENCE ELEMENT

(75) Inventors: Masahito Yamana, Hyogo (JP); Hiroki Yabe, Osaka (JP); Takahiro Koyanagi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/110,826

(22) PCT Filed: Apr. 11, 2012

(86) PCT No.: PCT/JP2012/059890
§ 371 (c)(1),
(2), (4) Date: Oct. 9, 2013

(87) PCT Pub. No.: WO2013/001891
PCT Pub. Date: Jan. 3, 2013

(65) Prior Publication Data
US 2014/0027753 A1   Jan. 30, 2014

(30) Foreign Application Priority Data

Jun. 28, 2011   (JP) .................................. 2011-143314

(51) Int. Cl.
*H01L 33/00*   (2010.01)
*H01L 51/52*   (2006.01)

(52) U.S. Cl.
CPC ........ *H01L 51/5225* (2013.01); *H01L 51/5209* (2013.01); *H01L 51/5262* (2013.01); *H01L 2251/5369* (2013.01)

(58) Field of Classification Search
None
See application file for complete search history.

(56) References Cited

U.S. PATENT DOCUMENTS

| 2008/0067530 A1* | 3/2008 | Forrest et al. ................... 257/98 |
| 2010/0200886 A1* | 8/2010 | Krames et al. .................. 257/98 |
| 2012/0032138 A1* | 2/2012 | Kim et al. ....................... 257/13 |

FOREIGN PATENT DOCUMENTS

| JP | 2003-036969 A |   | 2/2003 |
| JP | 2004-349064 A |   | 12/2004 |
| JP | 2006-269251 A | * | 10/2006 |

(Continued)

OTHER PUBLICATIONS

Mikami et al., "Influence of Surface Plasmon Loss on Polarization Characteristics of Organic El", Proceedings of the 10$^{th}$ Organic EL Debate, S9-2, (cited in the Description), along with brief translation, 2010.

(Continued)

*Primary Examiner* — Bilkis Jahan
*Assistant Examiner* — Kevin Quinto
(74) *Attorney, Agent, or Firm* — Renner, Otto, Boisselle & Sklar, LLP

(57) ABSTRACT

Provided is a highly-reliable organic electroluminescence element in which loss of light due to surface plasmons generated on a metal surface is suppressed, the efficiency of light extraction to outside the element, and short circuits are unlikely to occur. The organic electroluminescence element includes a metal layer (1), on a surface of which a nanosize uneven structure is provided by a nanoparticle arrangement structure (6) in which nanoparticles (6*a*) are arranged in a planar fashion, and an organic layer (3) disposed on the uneven surface of the metal layer (1) and constituted by a plurality of layers including a light-emitting layer (31). Each interface between the plurality of layers of the organic layer (3) is flatter than the uneven surface of the metal layer (1).

9 Claims, 9 Drawing Sheets

(56) References Cited

FOREIGN PATENT DOCUMENTS

| | | |
|---|---|---|
| JP | 2006-269251 A | 10/2006 |
| JP | 2007-108724 A | 4/2007 |
| JP | 2007-234254 | 9/2007 |
| JP | 2008-166343 A | 7/2008 |
| JP | 2009-9861 A | 1/2009 |
| JP | 2010-170726 | 8/2010 |
| JP | 2011-154843 A | 8/2011 |

OTHER PUBLICATIONS

International Search Report and Written Opinion for corresponding International Application No. PCT/JP2012/059890, dated Jun. 24, 2013.

International Preliminary Report on Patentability for corresponding International Application No. PCT/JP2012/059890, dated Apr. 11, 2012.

* cited by examiner 6a 6a 6a
6

6a 6a 6a
6

ORGANIC ELECTROLUMINESCENCE ELEMENT

TECHNICAL FIELD

The present invention relates to an organic electroluminescence element.

BACKGROUND ART

Organic electroluminescence elements (organic EL elements) in which a light-emitting layer located between an anode and a cathode is formed on a transparent substrate are known. Such organic electroluminescence elements emit light by excitons generated by the recombination of electrons and holes injected as carriers into the light-emitting layer when a voltage is applied between electrodes. Inorganic electroluminescence elements in which an inorganic substance is used for the light-emitting layer are also known as electroluminescence elements. However, organic electroluminescence elements in which an organic substance is used as a fluorescent substance of the light-emitting layer have different properties from the inorganic substance, and development utilizing these characteristics has been conducted. For example, organic electroluminescence elements are used for various display devices and backlights because they enable high-intensity light emission at low voltage, enable light emission of various colors depending on the types of fluorescent substances, and are easily manufactured as a planar light-emitting panel. Moreover, in recent years, organic electroluminescence elements enabling high-intensity light emission have been realized, and their use for lighting apparatuses has attracted attention.

FIG. 17 shows a cross-section of a configuration of a general organic electroluminescence element. In this organic electroluminescence element, an anode layer 104 having optical transparency is provided on a substrate 105 having optical transparency, and an organic layer 103 constituted by a hole injecting layer 133, a hole transporting layer 132 and a light-emitting layer 131 is provided on this anode layer 104. Furthermore, a cathode layer 102 having light reflectivity is provided on the organic layer 103. When a voltage is applied between the anode layer 104 and the cathode layer 102, light is produced in the organic layer 103, and passes through the anode layer 104 and the substrate 105 directly or after being reflected by the cathode layer 102, thereby going outside.

CITATION LIST

Patent Literature

Patent Literature 1: JP 2009-9861 A

Non-Patent Literature

Non-Patent Literature 1: Proceedings of Organic EL Symposium of Japan 10th Meeting, S9-2 (2010)

SUMMARY OF INVENTION

Technical Problem

In an organic electroluminescence element such as shown in FIG. 17, a metal material having high light reflectivity and conductivity such as aluminum (Al) and silver (Ag) is generally used for the cathode layer 102.

However, it is known that with metal materials having high conductivity, a state called a plasmon occurs in which free electrons in the metal oscillate collectively and act as pseudo-particles. That is to say, if light with a predetermined wavelength strikes the surface of the metal material, waves of coarse and fine patterns of an electron density, that is, surface plasmons occurs, and these surface plasmons travels along the metal surface and then disappear (e.g., see Non-Patent Literature 1). In other words, as shown in FIG. 17, with an organic electroluminescence element, part of light arriving at the cathode layer 102 out of light produced in the light-emitting layer 131 (denoted by a star) may be propagated on the surface of the cathode layer 102 and then disappear (denoted by arrows). Light thus propagated on the surface of the cathode layer 102 is not extracted as effective light, which may result in a decrease in the light extraction efficiency of the organic electroluminescence element.

A method for forming an uneven corrugated structure (pleated structure) on each interface between a plurality of layers by providing a nano-order uneven structure on the substrate 105 and stacking the organic layer 103 including the anode layer 104 and the light-emitting layer 131, and the cathode layer 102 formed of metal in this order thereon has been developed in order to suppress loss of light due to the surface plasmons (e.g., see Patent Literature 1). With such a configuration, since the uneven corrugated structure converts the surface plasmons generated on the surface of the metal constituting the cathode layer 102 to light to be transmitted, it is possible to suppress loss of light due to the surface plasmons.

However, since the uneven structure is formed on all interfaces of the layers including each layer constituting the organic layer 3 in the uneven corrugated structure described in Patent Literature 1, the film thickness of the layers is not uniform and short circuits easily occur, so that the reliability of devices incorporating this organic electroluminescence element may be lowered.

The present invention was made in view of the problems described above, and it is an object thereof to provide an organic electroluminescence element in which loss of light due to surface plasmons generated on a metal surface is suppressed, the efficiency of light extraction to outside the element can be improved, short circuits are unlikely to occur, and reliability is high.

Solution to Problem

An organic electroluminescence element according to the present invention includes a metal layer provided on a surface with a nanosize uneven structure by a nanoparticle arrangement structure in which nanoparticles are arranged in a planar fashion and an organic layer disposed on an uneven surface of the metal layer and constituted by a plurality of layers including a light-emitting layer, wherein each interface between the plurality of layers of the organic layer is flatter than the uneven surface of the metal layer.

A preferable embodiment of the organic electroluminescence element is provided with any one or more following configurations.

The metal layer is formed on a surface of a substrate having the nanoparticle arrangement structure, and serves as an electrode.

The metal layer is formed on a surface of a substrate having the nanoparticle arrangement structure, and an insulating layer and an electrode are stacked in this order on the surface of the metal layer.

The uneven structure of the metal layer is formed by impressing the nanoparticle arrangement structure into the metal layer, and the metal layer serves as a substrate on which the organic layer is stacked.

The nanoparticle arrangement structure is a structure in which the nanoparticles are monodispersed.

The nanoparticle arrangement structure is a structure in which the nanoparticles are randomly arranged.

The nanoparticle arrangement structure is a mesh structure formed by linearly connecting silica nanoparticles.

Advantageous Effects of Invention

With the present invention, since loss of light due to surface plasmons generated on a metal surface can be suppressed by providing a fine uneven structure on the surface of a metal layer serving as a reflecting layer, it is possible to improve the efficiency of light extraction to outside the element. Furthermore, since each interface of layers in an organic layer is flatter than an uneven surface of the metal layer, short circuits in the element can be made less likely to occur. As a result, it is possible to obtain an organic electroluminescence element that has high light extraction efficiency and is highly reliable.

DESCRIPTION OF EMBODIMENTS

Embodiment 1

Figure 1:
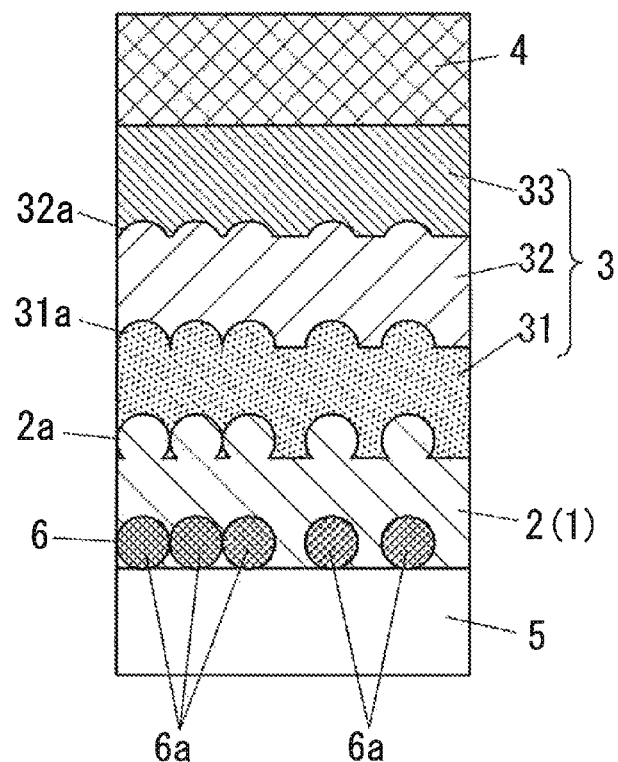
FIG. 1 is a schematic cross-sectional view showing an example of an embodiment of an organic electroluminescence element.

The organic electroluminescence element according to the present embodiment includes a metal layer 1 provided on its surface with a nanosize uneven structure by a nanoparticle arrangement structure 6 in which nanoparticles 6a are arranged in a planar fashion, and an organic layer 3 disposed on an uneven surface of the metal layer 1 and constituted by a plurality of layers including a light-emitting layer 31. Each interface between the plurality of layers of the organic layer 3 is flatter than the uneven surface of the metal layer 1. Note that "nanosize" herein means a size of about 1 nm or more to less than 1000 nm.

FIG. 1 shows an example of an embodiment of the organic electroluminescence element. In this organic electroluminescence element, the metal layer 1 is formed on a surface of a substrate 5 having a nanoparticle arrangement structure 6. In the present embodiment, the nanoparticle arrangement structure 6 is a structure in which a plurality of nanoparticles 6a are attached to the substrate 5. Furthermore, the metal layer 1 is formed on the surface of the substrate 5 on which the nanoparticle arrangement structure 6 is formed, and constitutes an electrode serving as a cathode (first electrode 2).

A plurality of raised portions 2a having a nano-order size are provided on the opposite surface of the metal layer 1 (first electrode 2) from the substrate 5. Hence, the surface of the first electrode 2 close to the organic layer 3 is uneven. The organic layer 3 including the light-emitting layer 31 is formed on the opposite surface of the metal layer 1 (first electrode 2) from the substrate 5. The organic layer 3 includes the light-emitting layer 31, a hole transporting layer 32 and a hole injecting layer 33 which are arranged in this order. In FIG. 1, each interface between the plurality of layers of the organic layer 3 is less uneven and flatter than the metal layer 1. Specifically, raised portions 31a are formed on the surface of the light-emitting layer 31, raised portions 32a are formed on the surface of the hole transporting layer 32, and the size (height and width) of the raised portions of the respective layers becomes gradually smaller in the order of the raised portions 2a, the raised portions 31a and the raised portions 32a. However, each interface between the plurality of layers of the organic layer 3 may be not uneven but flat. A second electrode 4 paired with the first electrode 2 is formed on the opposite side of the organic layer 3 to the metal layer 1. The interface between the first electrode 2 and the organic layer 3, that is, the interface between the second electrode 4 and the hole injecting layer 33 in the present embodiment is not uneven but flat. In this configuration, the first electrode 2 serves as the cathode that injects electrons into the organic layer 3, and the second electrode 4 serves as an anode that injects positive holes (holes) into the hole injecting layer 33. Hereinafter, a more specific configuration will be described.

Figure 2:
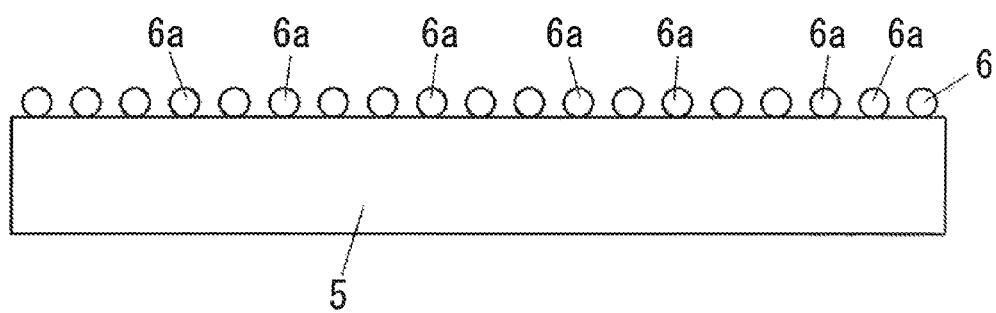
FIG. 2 is a schematic cross-sectional view showing an example of a nanoparticle arrangement structure.

As shown in FIG. 2, a substrate in which an uneven structure is formed on the surface by use of the nanoparticle arrangement structure 6 can be used as the substrate 5. The nanoparticle arrangement structure 6 can be formed by attaching nanoparticles 6a, which are nanosize particles, to the surface of the substrate 5. The nanoparticles 6a may be regularly arranged or randomly arranged. If they are randomly arranged, a random uneven structure can be formed on the surface of the metal layer 1, and therefore it is possible to obtain an organic electroluminescence element that has no directivity and wavelength dependence, and has high light extraction efficiency.

Examples of the substrate 5 include a rigid transparent glass plate such as soda glass and alkali-free glass, but are not limited thereto. It is possible to use any substrate including, for example, a flexible transparent plastic plate such as polycarbonate and polyethylene terephthalate, and a metal film composed of Al, copper (Cu), stainless steel or the like. Furthermore, it is preferable that the substrate 5 is made of material to which the nanoparticles 6a are easily attached. Note that the substrate 5 may constitute part of the first electrode 2 if the substrate 5 is made of conductive metal.

The nanoparticles 6a are particles having a nano-order size. The nanoparticle arrangement structure 6 is formed by attaching these nanoparticles 6a to the substrate 5 and a nano-order uneven structure is provided on the surface of the substrate 5. The size of the nanoparticles 6a is not particularly limited, but is preferably in a range of 10 nm to 200 nm. The height and the width of the uneven structure in the substrate 5 are defined by the size of the nanoparticles 6a. The uneven structure on the surface of the substrate 5 may be a corrugated structure (pleated structure) or a stripe, mesh (reticulation), lattice structure or the like.

Silica nanoparticles can be preferably used as the nanoparticles 6a. It is preferable that the size of the silica nanoparticles (particle diameter) is in a range of 10 nm to 200 nm. Hereinafter, the nanoparticle arrangement structure 6 in which the silica nanoparticles are used as the nanoparticles 6a will be mainly described, but the nanoparticle arrangement structure 6 can be similarly formed even using nanoparticles 6a different from the silica nanoparticles.

The nanoparticle arrangement structure 6 obtained by using the silica nanoparticles can be formed by first preparing the silica nanoparticles in a solution, and next coating the surface of the substrate 5 with the solution to attach the silica nanoparticles to the surface of the substrate. The method of preparing the silica nanoparticles in a solution is not particularly limited, and can be performed according to known methods.

Alkoxysilane can be used as a raw material of the silica nanoparticle, it is preferable that tetrafunctional alkoxysilane is used as this alkoxysilane, and tetraethoxysilane can be used, for example. Here, silica is suitable as the material for forming the nanoparticles 6a because highly transparent nano-order particles, the diameter of which can be controlled, are easily obtained at low cost by using silica. Furthermore, the silica nanoparticles have various advantages such as high heat resistance, high mechanical strength and, in addition, durability against chemicals including organic solvents.

Then, the alkoxysilane is added to the solution in which a basic amino acid is dissolved, the solution is heated such that alkoxysilane is subjected to hydrolysis and condensation polymerization, and thereby it is possible to prepare the silica nanoparticle in a solution. The silica formed by the hydrolysis and condensation polymerization of alkoxysilane in the presence of a basic amino acid becomes a nanosize sphere, and it is possible to prepare a colloidal solution in which the silica nanoparticles are dispersed.

Examples of solvents used for preparing a colloidal solution 60 in which the silica nanoparticles are dispersed include water; alcohol such as methanol, ethanol, propanol and butanol; ether such as diethyl ether, dibutyl ether, tetrahydrofuran and dioxane; aliphatic hydrocarbon such as hexane, heptane and octane; aromatic hydrocarbon such as benzene, toluene and xylene; ester such as ethyl acetate and butyl acetate; ketone such as methyl ethyl ketone and methyl isobutyl ketone; and halocarbon such as methylene chloride and chloroform, but are not particularly limited thereto.

It is preferable that a block copolymer is added to the colloidal solution 60 in which the silica nanoparticles are dispersed, and is uniformly dissolved by stirring. It is possible to easily attach the silica nanoparticles to the substrate 5 by adding the polymer. It is preferable that the block copolymer has different characteristics that are hydrophilicity and hydrophobicity inside the molecule, and the block copolymer in which a hydrophilic block and a hydrophobic block are alternately copolymerized can be used, for example. More specifically, a triblock copolymer in which hydrophilic polyethylene oxide blocks are copolymerized to both sides of a hydrophobic polypropylene oxide block can be used. For example, the block copolymer F127 having a structure shown in Chemical Formula 1 below can be used as the block copolymer.

[Chemical Formula 1]

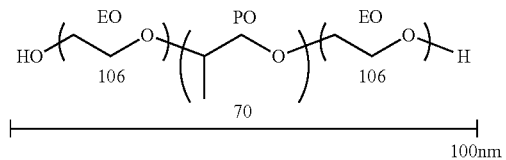

*MW = 12600 *HLB = 22
*CMC = 2.8 x 10⁻⁶M

In Chemical Formula 1 described above, "EO" denotes an ethylene oxide block, "PO" denotes a propylene oxide block, numerals shown therebelow are the number of repeated units, "MW" is a weight-average molecular weight, "HLB" is Hydrophile-Lipophile Balance, and "CMC" is a critical micelle concentration.

It is preferable that the pH of the colloidal solution 60 is adjusted in a state where the block copolymer has thus been dissolved in the colloidal solution 60. The pH can be adjusted using an acid such as hydrochloric acid or a base such as ammonia. Then, it is possible to vary the dispersed state of the silica nanoparticles in the colloidal solution 60 by adjusting the pH.

Here, if the pH is adjusted such that the colloidal solution 60 has a low pH, the silica nanoparticles are connected in the colloidal solution 60. It is possible to control a connecting density in accordance with the concentration of components in the colloidal solution, the temperature or the elapsed time, and it is also possible to form the silica nanoparticles linearly connected and a mesh structure in which they are further connected. On the other hand, if the pH is adjusted such that the colloidal solution has a high pH or does not have a low pH, the silica nanoparticles in the colloidal solution 60 will be in a monodispersed state where individual particles are uniformly dispersed without being flocculated with a uniform size. The silica nanoparticles thus monodispersed can be used. The pH for a monodispersed state is, for example, in a range of pH 7.6 or more (the preferable upper limit of pH is 14). Furthermore, the pH for linearly connecting is, for example, in a range of pH 7.5 or less (the preferable lower limit of pH is 4, and the more preferable lower limit is 6).

Then, the surface of the substrate 5 is coated with the colloidal solution 60 of the silica nanoparticles prepared while the dispersed state of the silica nanoparticles is maintained, and the silica nanoparticles can be attached to the surface of the substrate 5 to form the nanoparticle arrangement structure 6. Structures of the nanoparticle arrangement structure 6 thus formed include a structure in which the silica nanoparticles are arranged on the substrate 5 in a monodispersed state and a mesh structure in which the silica nanoparticles are arranged in a reticulation fashion by connecting the silica nanoparticles linearly, and repeatedly branching them and connecting them in a circular fashion.

First, the nanoparticle arrangement structure 6 formed with the monodispersed structure of the silica nanoparticles will be described.

Figure 3:
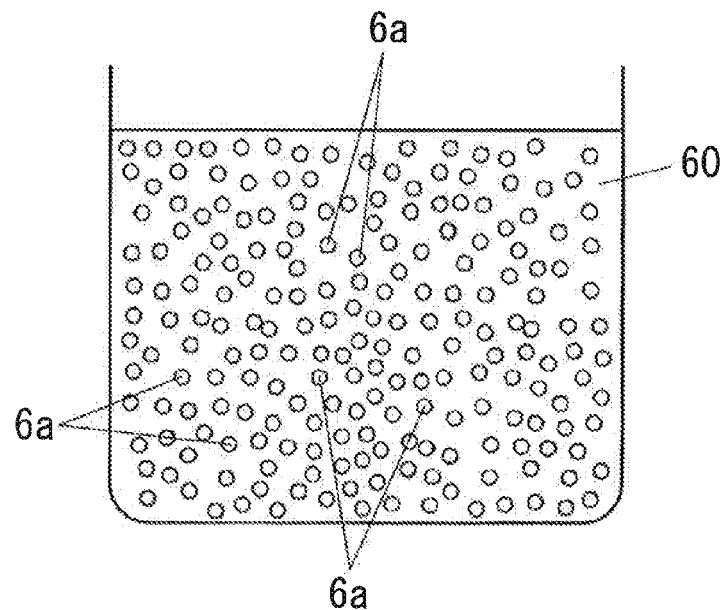
FIG. 3 is a schematic front view showing an example of dispersion of nanoparticles.

FIG. 3 schematically shows a state in which the silica nanoparticles, which are the nanoparticles 6a, are dispersed in the colloidal solution 60. In this colloidal solution 60, the silica nanoparticles are monodispersed in the solution. The pH of the solution may be adjusted as described above to disperse the silica nanoparticles in the colloidal solution 60. Then, the surface of the substrate 5 is coated with this colloidal solution 60. When the surface of the substrate 5 is thus coated with the colloidal solution 60, the silica nanoparticles monodispersed in the colloidal solution 60 attach to the surface of the substrate 5 while remaining in a monodispersed state. It is preferable in principle that the silica nanoparticles are monodispersed and arranged on the substrate 5 in a state where the individual particles do not touch each other, but it is acceptable for a plurality of the particles to touch and overlap each other in part of the silica nanoparticles. Furthermore, the silica nanoparticles in a monodispersed state may be caused to attach to the entire surface or part of the surface of the substrate 5.

Figure 4:
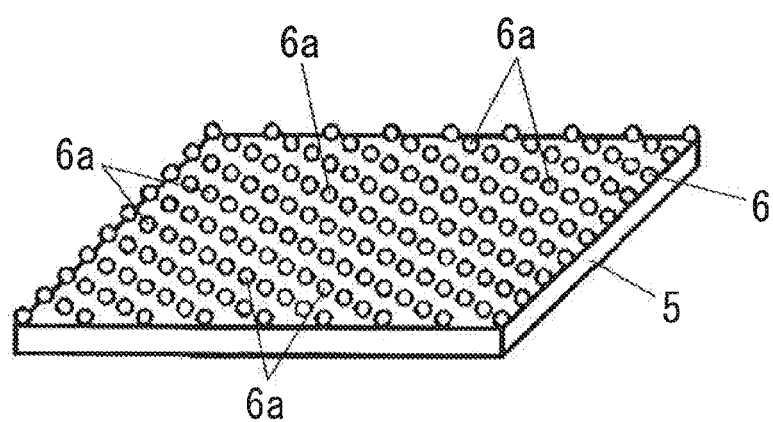
FIG. 4 is a schematic perspective view showing an example of the nanoparticle arrangement structure.
Figure 5:
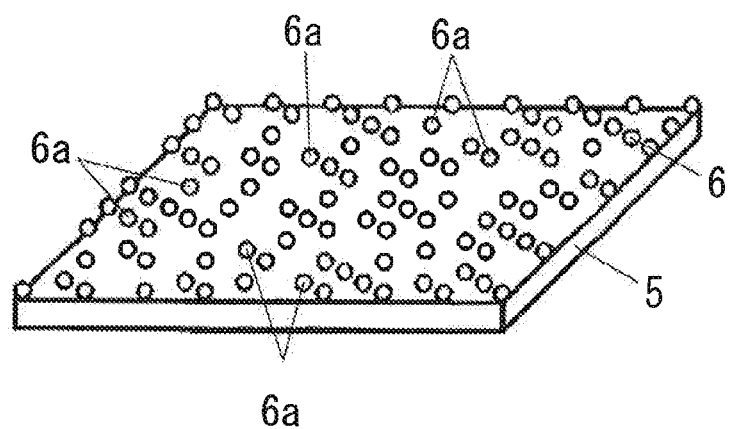
FIG. 5 is a schematic perspective view showing another example of the nanoparticle arrangement structure.

FIG. 4 and FIG. 5 show a state where the nanoparticle arrangement structure 6 that is the monodispersed structure of the nanoparticles 6a is formed by attaching the silica nanoparticles to the surface of the substrate 5 in a monodispersed state. FIG. 4 shows a structure in which the monodispersed silica nanoparticles are arranged longitudinally and horizontally at a predetermined interval and arrayed with a certain degree of regularity. Such a structure may be formed if the nanoparticles 6a repel each other to some extent. Furthermore, in FIG. 5, the monodispersed silica nanoparticles are arranged randomly without regularity. Such a structure may be formed by application of the colloidal solution 60 in which the silica nanoparticles are dispersed randomly. The silica nanoparticles can be randomly arranged in a monodispersed state to form a random uneven structure in the metal layer 1, and therefore it is possible to obtain an organic electroluminescence element that has no directivity and wavelength dependence, and has high light extraction efficiency.

The following is a more specific example of the method for monodispersing the silica nanoparticles in the colloidal solution 60. For example, tetraethoxysilane (TEOS) is added to the aqueous solution of lysine (L-lysine), which is a basic amino acid, the solution is stirred at 60° C. for 24 hours (500 rpm), and therefore it is possible to obtain the colloidal solution 60 of the silica nanoparticles with a particle diameter of about 15 nm. A molar ratio between raw materials at this time may be 1 (TEOS):154.4 ($H_2O$):x (L-lysine). Next, the block copolymer F127 (see above Chemical Formula 1) is added to the colloidal solution 60 prepared and is dissolved by stirring at 60° C. for 24 hours. A mass ratio of the additive amount of F127 on the basis of the amount of silica in the colloidal solution 60, that is, $SiO_2$:F127 may be 1:y. Subsequently, the pH is adjusted using an acid such as hydrochloric acid. The solution is left at rest at 60° C. for a definite period of time, and therefore the silica nanoparticles can be made to disperse in the colloidal solution 60. It is confirmed that the silica nanoparticles are monodispersed if x is 0.01 when y is 1 and the solution is left at rest at 60° C. for two weeks after the pH is adjusted to 7.2. Furthermore, it is confirmed that the silica nanoparticles are monodispersed at pH 8 if x is 0.02, y is 1 and the solution is left at rest at 60° C. for five days after the pH is adjusted. Also, it is confirmed that the silica nanoparticles with a particle diameter of 50 nm are monodispersed under the same conditions.

Next, the nanoparticle arrangement structure 6 that is a structure (mesh structure) in which the silica nanoparticle linearly connected are further connected will be described. As described above, if the pH is adjusted such that the colloidal solution 60 has a low pH in a process of preparing the colloidal solution 60 in which the silica nanoparticles are dispersed, a structure in which the silica nanoparticles are linearly connected in the colloidal solution 60 and a reticular mesh structure in which the silica nanoparticles linearly connected are further connected are formed. The nanoparticle arrangement structure 6 can be made into a mesh-shape to form a mesh-shaped uneven structure in the metal layer 1. The uneven structure in the form of mesh can suppress the occurrence of metal plasmons. Hence, it is possible to obtain an organic electroluminescence element having high light extraction efficiency.

Figure 6:
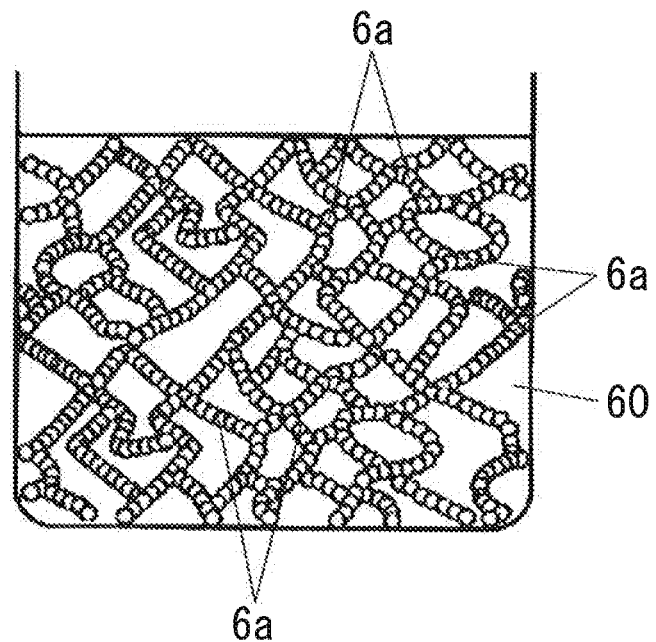
FIG. 6 is a schematic front view showing another example of dispersion of nanoparticles.

FIG. 6 schematically illustrates the colloidal solution 60 in which the silica nanoparticles that are nanoparticles 6a are linearly connected. In this colloidal solution 60, the silica nanoparticles are linearly connected and the reticular structure is formed as a whole. The silica nanoparticles can be connected by adjusting the pH. For example, if the pH of the colloidal solution 60 is adjusted to less than 8 using an acid such as hydrochloric acid, the silica nanoparticles start to be connected in the colloidal solution 60 and are linearly connected. This connecting structure is a ball chain-shaped array in which the silica nanoparticles are linearly or curvedly connected. A silica nanoparticle is connected to three or more silica nanoparticles to branch the connecting structure, and the silica nanoparticles are connected in a circular fashion to allow the connecting structure to have a reticular mesh structure.

Then, after the silica nanoparticles are linearly connected or connected in a mesh-shape in the colloidal solution 60, the surface of the substrate 5 is coated with this colloidal solution 60. When the surface of the substrate 5 has thus been coated with the colloidal solution 60, the silica nanoparticles connected linearly or in a mesh-shape in the colloidal solution 60 are attached to the surface of the substrate 5 while maintaining the structure to some extent, and the mesh structure is thus formed. The mesh structure of the silica nanoparticles may be a single layer structure or a multi-layer structure in which the linear connections vertically overlap, and is not necessarily a complete two-dimensional plane. Furthermore, the silica nanoparticles in the mesh structure may be made to attach to the entire surface or part of surface of the substrate 5.

Figure 7:
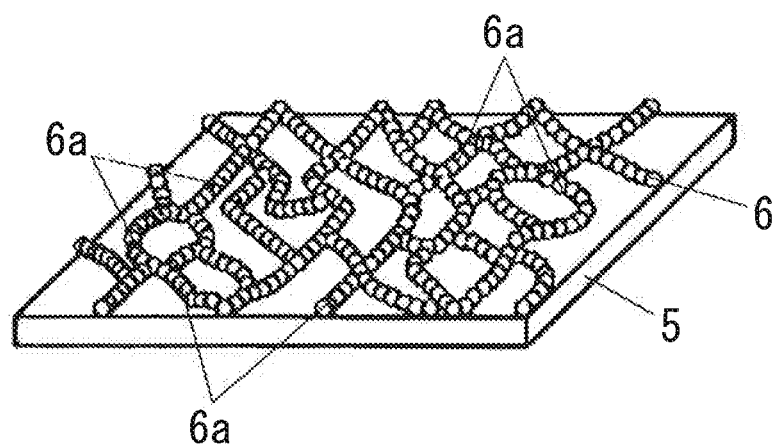
FIG. 7 is a schematic perspective view showing another example of the nanoparticle arrangement structure.

FIG. 7 shows a state where the nanoparticle arrangement structure 6 that is the mesh structure of the nanoparticles 6a is formed by attaching the silica nanoparticles connected linearly or in a mesh-shape to the surface of the substrate 5. The mesh structure may have random meshes. That is to say, the meshes may include random openings that differ in shapes and sizes. Furthermore, lines along the nanoparticles 6a linearly connected may extend in random directions.

The following is a more specific example of the method for linearly connecting the silica nanoparticles in the colloidal solution 60. Tetraethoxysilane (TEOS) is added to the aqueous solution of lysine (L-lysine), which is a basic amino acid, the solution is stirred at 60° C. for 24 hours (500 rpm), and therefore it is possible to obtain the colloidal solution 60 of the silica nanoparticles with a particle diameter of about 15 nm. A molar ratio between raw materials at this time is 1 (TEOS):154.4 ($H_2O$):x (L-lysine). Next, the block copolymer F127 (see above Chemical Formula 1) is added to the colloidal solution 60 prepared and is dissolved by stirring at 60° C. for 24 hours. A mass ratio of the additive amount of F127 on the basis of the amount of silica in the colloidal solution 12, that is, $SiO_2$:F127 may be 1:y. Subsequently, the pH is adjusted using hydrochloric acid. The solution is left at rest at 60° C. for a definite period of time, and therefore the silica nanoparticles can be linearly connected in the colloidal solution 60. It is confirmed that the silica nanoparticles are linearly connected if x is 0.02 or more when y is 1 and the solution is left at rest at 60° C. for two weeks after the pH is adjusted to 7.2. Furthermore, it is confirmed that the silica nanoparticles are linearly connected at pH 6 to 7 if x is 0.02, y is 1 and the solution is left at rest at 60° C. for five days after the pH is adjusted. Furthermore, it is confirmed that the silica nanoparticles are linearly connected if y, the additive amount of F127, is 0.5 to 2. Moreover, it is confirmed that the silica nanoparticles with a particle diameter of 50 nm are linearly connected under the same conditions.

Here, a method for coating the substrate 5 with the colloidal solution 60 can be selected from various general coating methods such as brush coating, spray coating, immersion (dipping, dip coating), roll coating, flow coating, curtain coating, knife coating, spin coating, table coating, seat coating, sheet coating, die coating, bar coating, but is not limited thereto. A method such as cutting and etching can be also used to process a coating film into any shape.

Furthermore, when the nanoparticles 6a are attached to the surface of the substrate 5 by coating the surface of the substrate 5 with the colloidal solution 60 to form the nanoparticle arrangement structure 6, it is preferable that components other than the nanoparticles 6a do not remain on the surface of the substrate 5. Examples of the components other than the nanoparticles 6a include organic components such as a basic amino acid and a block copolymer in the colloidal solution 60. It is preferable that these components are removed from the surface of the substrate 5. Examples of methods for removing other components include a method for immersing the substrate 5 in a liquid in which the nanoparticles 6a do not easily dissolve and in which the components to be removed are easily dissolved, although the durability of the substrate 5 needs to be taken into consideration. Examples thereof also include a method for removing other components by decomposition and vaporization using a heat treatment or an ultraviolet treatment while leaving the silica nanoparticles on the substrate 5.

As described above, the nanoparticle arrangement structure 6 in which the nanoparticles 6 are arranged in a planar fashion can be formed on the surface of the substrate 5 to form a nano-order fine uneven structure on the surface of the substrate 5. If specific wavelength dependence and outgoing angle dependence are required in devices incorporating the organic electroluminescence element, it is preferable that the height and the width of this uneven structure are selected to be uniform or periodical. On the other hand, in the case of improving light extraction efficiency as uniformly as possible in a broad wavelength range and all outgoing angles, it is preferable that the height and the width of this uneven structure are selected randomly. Furthermore, it is preferable that the height of this uneven structure is less than the film thickness of the layers constituting the organic layer 3. Since the uneven structure on the surface of the substrate 5 is formed with the nanoparticles 6a, the height and the width of the uneven structure are defined by the particle diameter of the nanoparticle 6a. Here, since the film thickness of the organic layer 3 is generally from 10 nm to 200 nm, the height of the uneven structure may be in a range of 10 nm to 100 nm.

Furthermore, it is preferable that the width of the uneven structure is greater than or equal to the height of the uneven structure.

The organic electroluminescence element of the present embodiment can be produced by forming the metal layer 1 (first electrode 2) serving as the cathode on the substrate 5 in which the uneven structure is formed by use of the nanoparticle arrangement structure 6 described above, and by stacking the organic layer 3 including the light-emitting layer 31 and the like and the second electrode layer 4 (anode) thereon in this order.

The metal layer 1 (first electrode 2) is formed of a material having light reflectivity. Examples of the material constituting the metal layer 1 (first electrode 2 (cathode)) include Al and Ag, or compounds containing these metals. Also, they may include a material constituting the metal layer 1 as a stacked structure or the like obtained by using Al and other electrode materials in combination. Examples of combinations of such electrode materials include a stacked body of alkali metal and Al, a stacked body of alkali metal and silver, a stacked body of alkali metal halide and Al, a stacked body of alkali metal oxide and Al, a stacked body of alkaline earth metal or rare earth metal and Al, and alloy of these kinds of metal and other metals. Specifically, examples thereof include a stacked body of sodium (Na), Na-potassium (K) alloy, lithium (Li), magnesium (Mg) or the like and Al; Mg—Ag mixture; Mg-indium mixture; Al—Li alloy; LiF/Al mixture/stacked body; and Al/$Al_2O_3$ mixture. The thickness of the metal layer 1 (first electrode 2) can be, for example, from 50 nm to 200 nm.

Then, the metal layer 1 is formed on the uneven surface (surface having the nanoparticle arrangement structure 6) of the substrate 5 with approximately uniform thickness. By doing so, the uneven structure on the surface of the substrate 5 is reflected on the exposed surface (interface on the organic layer 3 side) of the metal layer 1, and the uneven structure is formed on the surface of the metal layer 1. In other words, through a process of forming the metal layer 1 with vapor deposition or the like on the surface of the substrate 5 on which the nanoparticle arrangement structure 6 is provided, the metal layer 1 is formed on the uneven surface of the substrate 5 so as to have a shape depending on the uneven structure, and the uneven structure is provided on the opposite surface of the metal layer 1 to the substrate 5. This uneven structure is equal to or smaller than the uneven structure on the substrate 5 (nanoparticle arrangement structure 6). The uneven structure can be thus formed on the surface of the metal layer 1 constituting the first electrode 2 to suppress loss of light due to the surface plasmons. Note that the metal layer 1 may be formed with vapor deposition, sputtering, plating, coating or the like. In short, the metal layer 1 may be formed such that the uneven structure on the substrate 5 is easily reflected on the surface of the metal layer 1.

In the embodiment shown in FIG. 1, raised portions 2a of the first electrode 2 (metal layer 1) are formed by the protrusions of the nanoparticle arrangement structure 6 in the substrate 5. It is preferable that the uneven structure (raised portions 2a) of the metal layer 1 thus formed is formed so as to have a height from 10 nm to 200 nm and a width greater than or equal to this height of the uneven structure. If the height of the uneven structure, that is, the protruding height of the raised portion 2a is less than 10 nm, the effect reducing the loss of light due to the surface plasmons may no longer be expected. Furthermore, if the height of the uneven structure 2, that is, the protruding height of the raised portion 2a is more than 200 nm, it is higher than the film thickness of the organic layer, and therefore short circuits in the element may easily occur. Also, if the width of the uneven structure (raised portion 2a) is less than the height of the uneven structure (raised portion 2a), short circuits in the element may easily occur. Accordingly, it is preferable that the uneven structure of the metal layer 1 is formed so as to have a height from 10 nm to 200 nm and a width greater than or equal to this height of the uneven structure, and thereby it is possible to reduce the loss of light and suppress short circuits. A shape of the raised portion 2a of the first electrode 2 (metal layer 1) may be a hemi-sphere, a cone or the like. Furthermore, the metal layer 1 may have a structure in which a plurality of raised portions 2a are arranged in a dot-shape, a structure in which a plurality of raised portions 2a are connected to form a mesh with random meshes, or a patterned structure such as a stripe structure and a lattice structure in a plan view of the metal layer 1.

Figure 17:
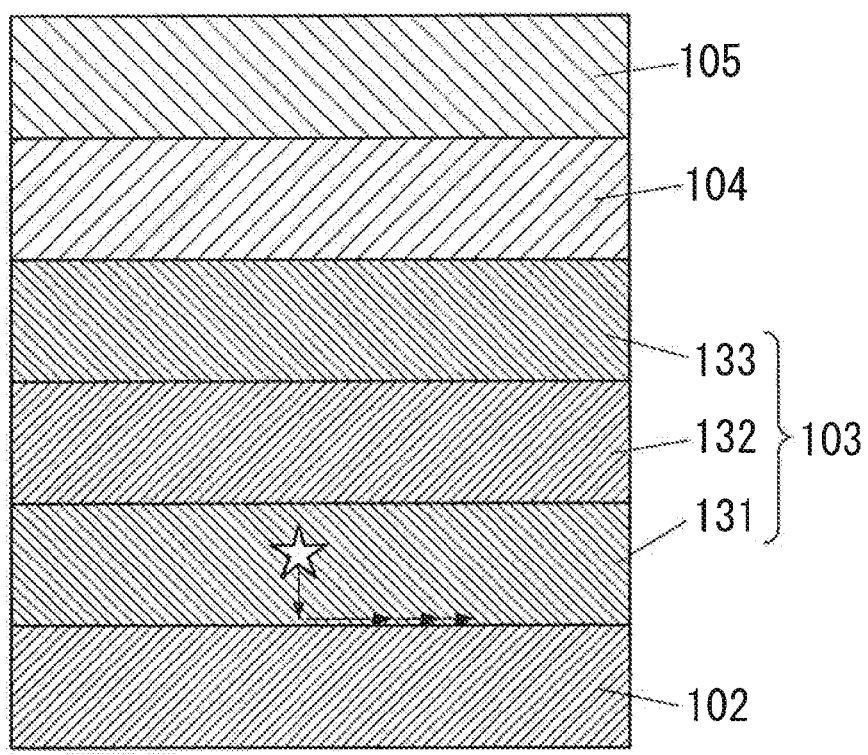
FIG. 17 is a schematic cross-sectional view illustrating plasmons in the organic electroluminescence element.

Incidentally, a general organic electroluminescence element as shown in FIG. 17 is produced by forming an anode layer 104 having optical transparency on the substrate 105, and by forming an organic layer 103 and a cathode layer 102 and the like thereon in this order. In this case, to suppress short circuits, surface roughness on the surface of the anode layer 104 needs to be reduced in a process of forming the organic layer 103 on the anode layer 104. The anode layer 104 is generally formed by patterning to define a light-emitting area and to prevent short circuits between the anode layer 104 and the cathode layer 102. This patterning includes methods such as bank formation after film formation, etching and print patterning by screen printing or the like. Generally, bank formation or etching has processes of a resist coating and immersion in a developer and a resist peeling liquid, and the characteristics as an anode may be deteriorated because an anode formed by wet process is susceptible to damage. Furthermore, in patterning by printing, if screen printing is used for example, a surface is likely to be uneven due to the screen mesh. Furthermore, if gravure printing, slit die coating or the like is used, a level difference in film thickness may be generated at the position in which coating starts and ends. These surface roughness and level difference in a film thickness cause short circuits to occur if the element is formed by stacking the organic layer 103 on the anode layer 104. In the printing methods described above, if the viscosity of ink for printing is reduced, improvement of leveling properties after coated can be expected. However, reduction of the viscosity thereof may cause a problem in that it becomes difficult to thicken films. Generally, if conductive macromolecular material such as high conductive type PEDOT:PSS that is frequently used as a material of electrodes formed by a wet process is used, a film thickness approximately from 500 nm to 1000 nm is needed to obtain a conductivity equal to a transparent oxide conductive film such as ITO with a film thickness approximately from 100 nm to 200 nm. Accordingly, the use of this kind of conductive macromolecular material may cause a problem in that the viscosity of ink for printing is not reduced easily. Furthermore, since it is relatively easy to reduce the film thickness when highly a conductive material is used, it is possible to reduce the viscosity of ink for printing, but it is not easy to form the anode layer 104 stably because there are problems of wettability to a substrate, bleeding and the like in this case.

On the other hand, if the metal layer 1 constituting the cathode (first electrode 2) serving as a light reflecting layer is formed first on the substrate 5, a stacked structure is formed in an opposite order to the usual order of elements. In other words, the second electrode 4 serving as the anode is formed after the organic layer 3 is formed. Thereby, there is no risk of damaging the organic layer 3 by the surface roughness of the second electrode 4, and therefore it is possible to effectively suppress short circuits. Furthermore, it is possible to improve the reliability of devices incorporating this organic electroluminescence element.

It is also preferable that a layer that promotes electron injection from the first electrode 2 (cathode) to the light-emitting layer 31, that is, at least one of an electron injecting layer and an electron transporting layer is inserted between the first electrode 2 and the light-emitting layer 31. Examples of materials constituting the electron injecting layer or the electron transporting layer include common materials with the materials constituting the metal layer 1 described above; metal oxides such as titanium oxide and zinc oxide; and organic semiconductor materials which includes materials described above and to which dopant promoting the electron injection is mixed, but are not limited thereto. These layers can also be formed using a method such as vapor deposition, sputtering, plating and coating. The uneven structure may be formed depending on the raised portions 2a of the first electrode 2 on the opposite surface of the electron injecting layer or the electron transporting layer to the metal layer 1. It is preferable that the height and the width of this uneven structure are less than or equal to those of the uneven structure of the metal layer 1. The layer farther from the metal layer 1 may have the uneven structure with the smaller height and the smaller width. Furthermore, if at least one of the electron injecting layer and the electron transporting layer is provided between the first electrode 2 and the light-emitting layer 31, a distance between the first electrode 2 and the light-emitting layer 31 is increased. Hence, each interface between the plurality of layers of the organic layer 3 can be less susceptible to the uneven structure of the metal layer 1.

Then, the organic layer 3 and the second electrode 4 are stacked directly or via at least one of the electron injecting layer and the electron transporting layer on the metal layer 1 thus formed. The organic layer 3 includes at least the light-emitting layer 31. In the embodiment shown in FIG. 1, the hole transporting layer 32 and the hole injecting layer 33 are provided between the light-emitting layer 31 and the second electrode 4 in the organic layer 3.

It is preferable that each of the layers (light-emitting layer 31, hole transporting layer 32 and hole injecting layer 33) of the organic layer 3 and the second electrode 4 are formed of a coating type material. At this time, it is possible to use a method of applying a solution obtained by dissolving or dispersing the materials constituting each layer in a solvent as a stacking method. In that case, the organic layer 3 and the second electrode 4 can be deposited by coating such as spin coating, spray coating, die coating and gravure printing, and it is possible to effectively form a plurality of layers. Furthermore, the layers can be formed by using the coating method such that the uneven structure of each interface between the plurality of layers of the organic layer 3 is smaller in height than the uneven structure of the metal layer 2 and becomes smaller as the interfaces get closer to the second electrode 4. That is to say, when the uneven surface is coated with the organic material constituting the light-emitting layer 31, the organic material collects in the recessed portions of the metal layer 1. Therefore, in the light-emitting layer 31, the film thickness of a portion corresponding to the recessed portions of the metal layer 1 is a little greater than that of portions corresponding to the raised portions of the metal layer 1, so that the uneven surface of the light-emitting layer 31 is less uneven than the uneven surface of the metal layer 1. In short, a force works in a direction that flattens the material applied to the uneven surface while the material spreads along the uneven structure of the lower layer, and the upper layer formed is less uneven than the lower layer. Similarly, the hole transporting layer 32 has a flatter uneven surface than the light-emitting layer 31, with the surface of the layers being flatter as the layers get closer to the second electrode 4.

In this manner, raised portions 31a of the light-emitting layer 31 that are smaller in height and width than the raised portions 2a of the first electrode 2 are formed on the surface of the light-emitting layer 31 that is formed on the surface on which the raised portions 2a of the first electrode 2 are provided. Also, raised portions 32a of the hole transporting layer 32 that are even smaller than the raised portion 31a of the light-emitting layer 31 are formed on the surface of the hole transporting layer 32 that is formed on the surface on which the raised portion 31a of the light-emitting layer 31 are provided. Then, the interface between the second electrode 4 and the layer (hole injecting layer 33 in the embodiment shown in FIG. 1), which is adjacent to the second electrode 4, in the organic layer 3 can be flattened. If the interface between the second electrode 4 and the organic layer 3 is flat, short circuits in this interface can be effectively suppressed.

It is preferable that each interface between the plurality of layers of the organic layer 3 is less uneven than the metal layer 1, and a height of 10 nm or less, for example, can be achieved. The uneven structure need not be present in the organic layer 3, and if present, the uneven structure preferably is as small as possible. A thickness of 10 nm to 100 nm, for example, can be achieved for each layer of the organic layer 3.

Here, if each layer of the organic layer 3 is stacked by a coating process, a substrate layer (e.g., light-emitting layer 31) may be melted by a layer formed as an upper layer (e.g., hole transporting layer 32) in the organic layer 3. Furthermore, there are cases where the coating solution of one layer does not spread uniformly on the previous layer in the organic layer 3 due to poor wettability or the like. Accordingly, concerning the film thickness, for example, it is preferable that the amount of the layer melted by forming the next layer (upper layer) is taken into consideration in advance and that the previous layer (lower layer) is formed such that the film thickness thereof is greater than the target film thickness. Furthermore, it is preferable that a solvent (e.g., alcohol) that enhances the wettability is added to the coating solution to improve the wettability.

Examples of organic electroluminescence materials constituting the light-emitting layer 31 include polyparaphenylene vinylene derivatives, polythiophene derivatives, polyparaphenylene derivatives, polysilane derivatives, polyacetylene derivatives or the like, polyfluorene derivatives, polyvinyl carbazole derivatives and polymers of the above pigment-based or metal complex-based light-emitting materials; anthracene, naphthalene, pyrene, tetracene, coronene, perylene, phthaloperylene, naphthaloperylene, diphenyl butadiene, tetraphenyl butadiene, coumarin, oxadiazole, bisbenzoxazolin, bisstyryl, cyclopentadiene, coumarin, oxadiazole, bisbenzoxazolin, bisstyryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri-(p-terphenyl-4-yl)amine, pyran, quinacridone, rubrene and derivatives thereof; or 1-aryl-2,5-di(2-thienyl)pyrrole derivatives, distyrylbenzene derivatives, styrylarylene derivatives, styrylamine derivatives and compounds having groups composed of these light-emitting compounds as a part of the molecule. Also, the so-called phosphorescent light-emitting materials including, for example, light emitting materials such as Ir complex, Os complex, Pt complex and europium complex, or compounds or polymers having these complexes in the molecule can be suitably used besides the compounds derived from fluorescent dyes that are represented by the above compounds. These materials can be appropriately selected and used as needed.

Low-molecular to macromolecular materials having low LUMO can be used as the materials constituting the hole transporting layer 32. Examples of such materials include polymers containing aromatic amines such as polyarylene derivatives having aromatic amines in the side chains or the backbone such as polyvinyl carbazole (PVCz), polypyridine and polyaniline, but are not limited thereto.

Examples of materials constituting the hole injecting layer 33 include organic materials such as thiophene, triphenylmethane, hydrazoline, arylamine, hydrazone, stilbene and triphenylamine. Specific examples thereof include aromatic amine derivatives such as polyvinyl carbazole (PVCz), polyethylenedioxy thiophene polystyrene sulfonate (PEDOT:PSS) and TPD. These materials may be used alone or in combination of two or more.

The second electrode 4 is formed of conductive material having optical transparency. Examples of conductive materials constituting the second electrode 4 (anode) include fine metal particles such as Ag, indium-tin oxide (ITO), indium-zinc oxide (IZO), tin oxide and Au; conductive macromolecules; conductive organic materials; organic layers containing dopant (donor or acceptor); mixture of conductive materials and conductive organic materials (including macromolecules); and mixtures of these conductive materials and non-conductive materials, but are not limited thereto. Furthermore, examples of non-conductive materials include acrylic resin, polyethylene, polypropylene, polyethylene terephthalate, polymethyl methacrylate, polystyrene, polyethersulfone, polyarylate, polycarbonate resin, polyurethane, polyacrylnitrile, polyvinyl acetal, polyamide, polyimide, diacrylic phthalate resin, cellulose-based resin, polyvinyl chloride, polyvinylidene chloride, polyvinyl acetate, other thermoplastic resins and copolymers of two or more kinds of monomers constituting these resins, but are not limited thereto. Also, doping by using a dopant such as sulfonic acid, Lewis acid, protonic acid, alkali metal, and alkaline earth metal may be performed in order to improve the conductivity. Note that the dopant is also not limited thereto.

Furthermore, it is possible to use a layer having a mesh structure (e.g., reticular structure and grid structure) that is formed with thin lines of metal material such as Ag and Cu or conductive material such as carbon besides the conductive materials described above for the electrode layer. It is preferable that the size of the thin line width is from 1 μm to 100 μm in view of conductivity and optical transparency. Note that the thin lines may have any width interval and any aspect ratio. The mesh structure and the grid structure can be formed by screen printing or the like using conductive pastes including materials described above, but materials and methods are not limited thereto.

In the organic electroluminescence element of the present embodiment, light generated in the organic layer 3 (light-emitting layer 31) is transmitted through the second electrode 4 directly or after being reflected by the metal layer 1, and is extracted to the outside of the element. Then, with the present embodiment, since the uneven structure having a nano-order size is provided on the surface of the metal layer 1 (first electrode 2), it is possible to suppress the loss of light due to surface plasmons and to reflect more light in the direction of the second electrode 4 by converting surface plasmons generated on the metal surface to light to be transmitted, and therefore it is possible to improve the efficiency of light extraction to outside the element. Furthermore, since each interface between the plurality of layers of the organic layer 3 is less uneven than the metal layer 1, it is possible to suppress short circuits inside the element. Moreover, each interface between the plurality of layers of the organic layer 3 can be made to be less uneven than the metal layer 1 by producing the element with coating processes using coating materials for the organic layer 3 and the second electrode 4.

Incidentally, it is also possible to manufacture the organic electroluminescence element of the embodiment shown in FIG. 1 by a roll-to-roll method. In that case, it is possible to use a band-shaped sheet material that is made of a flexible material and supplied in a state where it is wound in a roll-shape as the substrate 5. Examples of materials of the substrate 5 include a resin sheet and metal foil. First, the nanoparticle arrangement structure 6 is formed on the band-shaped substrate 5. Next, the metal layer 1 is formed thereon, and each layer of the organic layer 3 is continuously formed further thereon by a slit coater or the like, and lastly the second electrode 4 is formed at a predetermined interval by screen printing or the like. After stacking the respective layers, the resultant sheet can be gathered up by being wound in a roll-shape again. By doing so, it is possible to produce a light-emitting sheet roll on which a plurality of the organic electroluminescence elements are continuously formed by the so-called roll-to-roll method. Then, if this light-emitting sheet roll is cut at a predetermined interval, it is possible to mass-produce a plurality of the organic electroluminescence elements in a short time. Particularly, in recent years, the organic layer 3 tends to have a multilayered structure by producing the light-emitting layer 31 having a plurality of layers, and arranging an electric charge adjusting layer between them. The formation of the organic layer 3 by a roll-to-roll method allows organic layers composed of a plurality of layers such as described above to be mass-produced at the same time and the process cost to be reduced.

Embodiment 2

Figure 8:
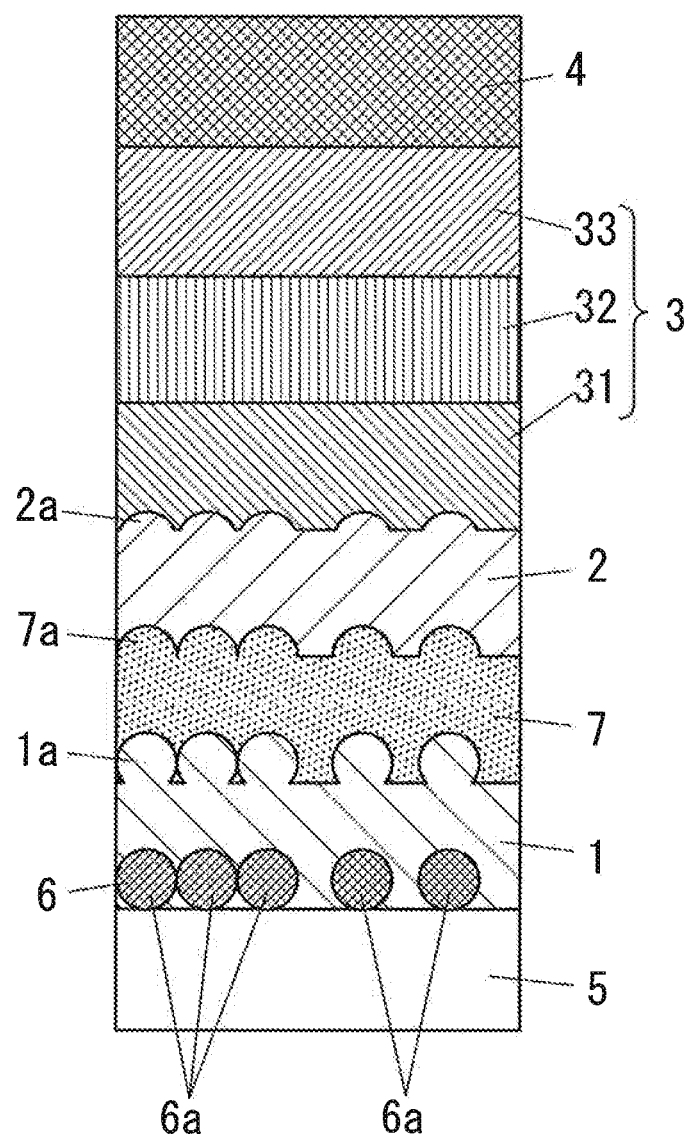
FIG. 8 is a schematic cross-sectional view showing another example of an embodiment of the organic electroluminescence element.

FIG. 8 shows another example of an embodiment of the organic electroluminescence element. In the organic electroluminescence element of the present embodiment, the metal layer 1 serves as a reflecting layer, but does not serve as an electrode. The metal layer 1 is provided on the uneven surface of the substrate 5, and an insulating layer 7 and the electrode (first electrode 2) are arranged in this order on the uneven surface of the metal layer 1. Each of layers (light-emitting layer 31, hole transporting layer 32 and hole injecting layer 33) of the organic layer 3 and the second electrode 4 are stacked in this order on the first electrode 2. Furthermore, the metal layer 1 has light reflectivity, and the first electrode 2 and the second electrode 4 have optical transparency. The first electrode 2 serves as the cathode for applying a voltage to the organic layer 3, and the second electrode 4 serves as the anode. At least one of the electron injecting layer and the electron transporting layer may be provided between the first electrode 2 and the light-emitting layer 31.

The uneven structure is formed on the surface of the metal layer 1. This uneven structure of the metal layer 1 can be formed with the same method as described in Embodiment 1. That is to say, the uneven structure can be formed by stacking the metal layer 1 on the substrate 5 that has the nanoparticle arrangement structure 6 formed by the nanoparticles 6a on its surface.

Then, the organic electroluminescence element of the present embodiment can be produced by stacking the insulating layer 7, the first electrode 2, the organic layer 3 and the second electrode 4 on this surface of the metal layer 1. Each layer can be stacked by using a method such as coating or vapor deposition in the same manner as in Embodiment 1. With using coating processes, the uneven structures of different surfaces can be easily made gradually smaller.

In the embodiment shown in FIG. 8, the first electrode 2 is not constituted by the metal layer 1, and is provided, on the substrate 5 via the metal layer 1 and the insulating layer 7, as a different layer from the metal layer 1. Therefore, the first electrode 2 is less uneven than the metal layer 1. In other words, the height of the raised portion becomes gradually smaller in the order of the raised portion 1a of the metal layer 1, the raised portion 7a of the insulating layer 7 and the raised portion 2a of the first electrode 2. The interface between the light-emitting layer 31 and the hole transporting layer 32 is flat. Other configurations such as the organic layer 3 and the first electrode 2 can be made in a similar manner as the embodiment shown in FIG. 1.

With the present embodiment, short circuits can be suppressed more reliably because the first electrode 2 is less uneven than the metal layer 1. That is to say, if the metal layer 1 is made to serve as the first electrode 2 as in the embodiment shown in FIG. 1, the organic layer 3 is stacked on the first electrode 2, but if the first electrode 2 is provided via the insulating layer 7 separately from the metal layer 1 as in the present embodiment, the metal layer 1 and the organic layer 3 are separated from each other. Accordingly, since the uneven structure of each interface between the plurality of layers of the organic layer 3 caused by the uneven structure on the surface of the metal layer 1 can be made smaller, and in some cases all of the interfaces in the organic layer 3 can be not uneven but flat, it is possible to suppress short circuits more effectively.

In the present embodiment, since the first electrode 2 has optical transparency, the light emitted towards the first electrode 2 out of light produced in the light-emitting layer 31 passes through the first electrode 2 and the insulating layer 7, and strikes the metal layer 1. At this time, the light is reflected by the metal layer 1 because the metal layer 1 serves as a reflecting layer. Then, the reflected light travels toward the second electrode 4 and is emitted to the outside through the second electrode 4.

The same materials as in Embodiment 1 can be used as materials of the metal layer 1. The thickness of the metal layer 1 can be selected in the same manner as in Embodiment 1.

The material of the insulating layer 7 can be, for example, PMMA (polymethyl methacrylate resin), an imide-based resin or a thiourethane-based resin, but is not limited thereto. The insulating layer 7 is constituted by an optically transparent material. The thickness of the insulating layer 7 can be set to from 50 nm to 200 nm, for example.

The same materials as in the second electrode 4 of the embodiment shown in FIG. 1 can be used as materials of the first electrode 2. The thickness of the first electrode 2 can be in a range of 50 nm to 200 nm, for example. The same materials as in the embodiment shown in FIG. 1 can be also used as materials of the organic layer 3 and the second electrode 4.

With the present embodiment, since the uneven structure having a nano-order size is provided on the surface of the metal layer 1, it is possible to suppress the loss of light due to the surface plasmons by converting the surface plasmons generated on the metal surface to light to be transmitted and to improve the efficiency of light extraction to the outside of the element. Furthermore, since each interface between the plurality of layers of the organic layer 3 can be made to be less uneven than the metal layer 1, and in some cases all of the interfaces in the organic layer 3 can be made to be not uneven but flat, it is possible to further suppress short circuits inside the element. Moreover, an interface between the layers of the organic layer 3 can be made to be less uneven than the metal layer 1 by producing the element with coating processes using coating materials for the organic layer 3 and the second electrode 4.

Note that although a configuration in which the first electrode 2 serves as the cathode and the second electrode 4 serves as the anode has been described in the present embodiment, a configuration in which the first electrode 2 serves as an anode and the second electrode 4 serves as a cathode can be used. In that case, improvement of light extraction efficiency and suppression of short circuits can also be expected. Note that, in this case, each layer of the organic layer 3 between the first electrode 2 and the second electrode 4 can be stacked in reverse order to that described above.

Embodiment 3

An embodiment in which the uneven structure of the metal layer 1 is formed by impressing the nanoparticle arrangement structure 6 into the metal layer 1 will be described as Embodiment 3. In the present embodiment, metal molding such as metal foil, metal sheets, metal film or metal plates can be used as the metal layer 1. However, it is preferable that the metal layer 1 has ductility and flexibility such that the uneven structure is easily formed. The same materials as described in Embodiment 1 can be used as materials of the metal layer 1.

Figure 9:
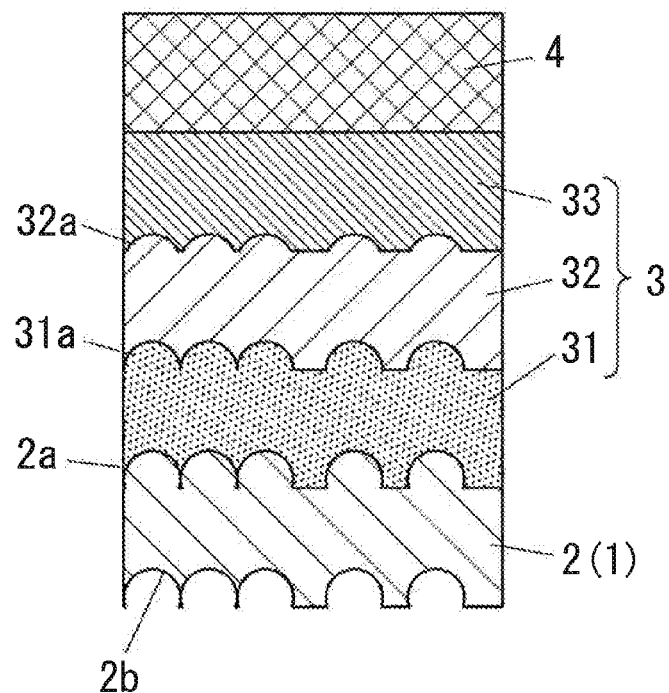
FIG. 9 is a schematic cross-sectional view showing another example of an embodiment of the organic electroluminescence element.

FIG. 9 shows an example of an embodiment of the organic electroluminescence element. In this organic electroluminescence element, the metal layer 1 serves as a substrate on which the organic layer 3 is formed by being stacked while also serving as the first electrode 2 (cathode). The uneven structure is formed on the surface of the metal layer 1 close to the organic layer 3. This uneven structure can be formed by pressing the substrate 5 having the nanoparticle arrangement structure 6 as a mold against the back surface (opposite surface of the metal surface 1 to the organic layer 3) of the metal layer 1 to impress the nanoparticles 6a into the metal layer 1, and causing the raised portions 2a to be raised in relief on the front surface. The shape of the uneven structure is transferred from the mold to the metal layer 1 by impressing this nanoparticle arrangement structure 6 into the metal layer 1. Recessed portions 2b are formed on the back surface of the metal layer 1 at positions corresponding to the raised portions 2a with this method. The substrate 5 having the nanoparticle arrangement structure 6 as described in FIG. 2 to FIG. 7 can be used as a substrate serving as the mold.

Then, the organic electroluminescence element having the layer configuration shown in FIG. 9 can be obtained by stacking the respective layers (light-emitting layer 31, hole transporting layer 32 and hole injecting layer 33) of the organic layer 3 and the second electrode 4 on the surface of the first electrode 2 (metal layer 1) on which the raised portions 2a are provided. Note that at least one of the electron injecting layer and the electron transporting layer may be provided between the first electrode 2 and the light-emitting layer 31. Each layer of the organic layer 3 can be stacked by using coating processes in the same manner as in Embodiment 1. With using coating processes, the uneven structures of different surfaces can be easily made gradually smaller.

Figure 10:
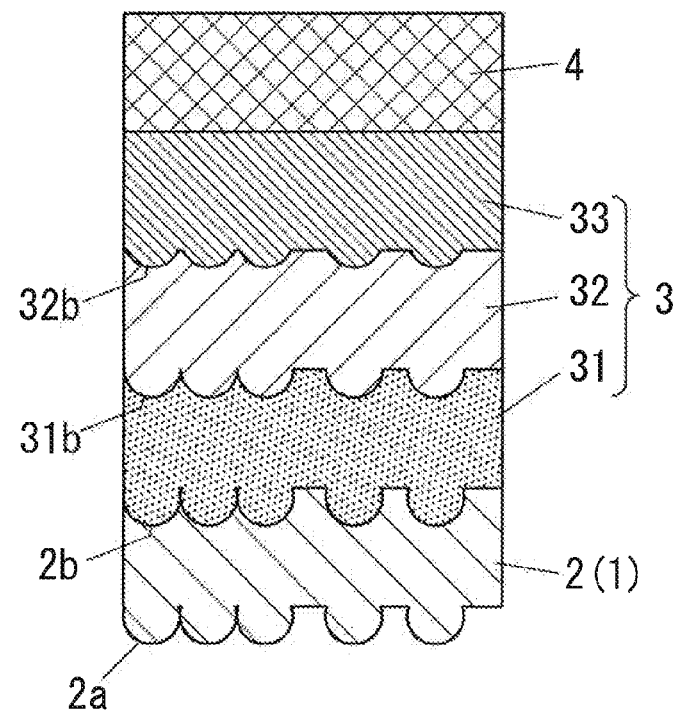
FIG. 10 is a schematic cross-sectional view showing another example of an embodiment of the organic electroluminescence element.

FIG. 10 shows another example of an embodiment of the organic electroluminescence element. In this organic electroluminescence element, the metal layer 1 serves as a substrate on which the organic layer 3 is formed by being stacked while also serving as the first electrode 2 (cathode). The uneven structure is provided on the surface of the metal layer 1 on the organic layer 3 side. This uneven structure can be formed by pressing the substrate having the nanoparticle arrangement structure 6 as a mold against the front surface (surface close to the organic layer 3) of the metal layer 1 to impress the nanoparticles 6a into the metal layer 1, and recessing the recessed portions 2b on the front surface. The shape of the uneven structure is transferred from the mold to the metal layer 1 by impressing this nanoparticle arrangement structure 6 into the metal layer 1. The raised portions 2a may or may not be formed on the back surface of the metal layer 1 at positions corresponding to the recessed portions 2b by this method. The substrate 5 having the nanoparticle arrangement structure 6 as described in FIG. 2 to FIG. 7 can be used as a substrate serving as the mold.

Then, the organic electroluminescence element having the layer configuration shown in FIG. 10 can be obtained by stacking the respective layers (light-emitting layer 31, hole transporting layer 32 and hole injecting layer 33) of the organic layer 3 and the second electrode 4 on the surface of the first electrode 2 (metal layer 1) on which the recessed portions 2b are provided. Note that at least one of the electron injecting layer and the electron transporting layer may be provided between the first electrode 2 and the light-emitting layer 31.

The respective layers of the organic layer 3 can be stacked by using coating processes in the same manner as in Embodiment 1. With using coating processes, the uneven structures of different surfaces can be easily made gradually smaller. In the embodiment shown in FIG. 10, the size of the recessed portions becomes gradually smaller with coating processes in the order of the recessed portion 2b of the first electrode 2, the recessed portion 31b of the light-emitting layer 31 and the recessed portion 32b of the hole transporting layer 32. That is to say, since the coating solution tends to collect in recessed portions when applied in the same manner as described in Embodiment 1, as in the case of raised portions, the size of the recessed portions becomes smaller as more layers are stacked. Therefore, each interface of the plurality of layers of the organic layer 3 can be made to be less uneven than the first electrode 2, and to be flat. Then, the interface between the second electrode 4 and the organic layer 3 can be made to be not uneven but flat.

With the embodiments shown in FIG. 9 and FIG. 10, since the surface of the metal layer 1 serving as the first electrode 2 (cathode) is exposed, an electrode extraction portion for connecting power supply wiring or the like can be also provided at any position in the metal layer 1. Furthermore, if flexible metal such as metal foil is used for the metal layer 1 serving as the substrate, it is possible to achieve sealing that is less expensive than and equivalent to a barrier film, and to considerably reduce manufacturing cost.

In Embodiment 3, the uneven structure is easily formed by a roll-to-roll method, and then, the organic layer 3 is easily stacked by a roll-to-roll method.

Figure 11:
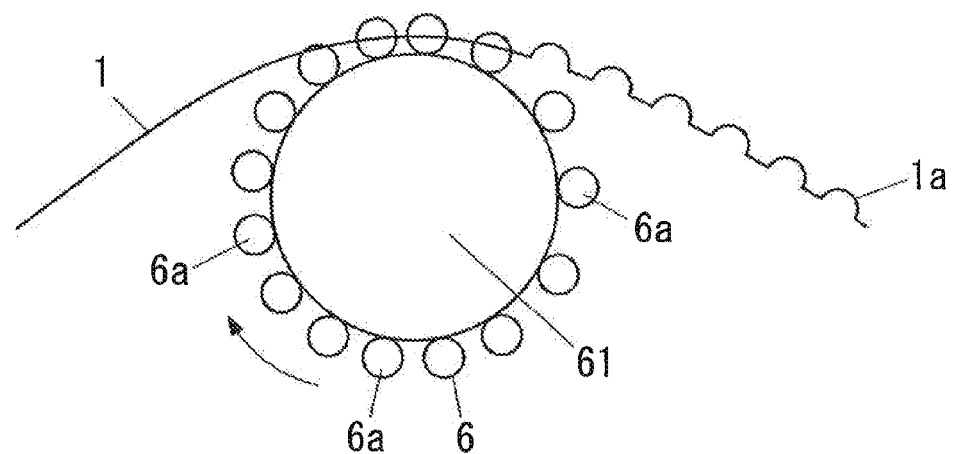
FIG. 11 is a schematic cross-sectional view showing an example of forming the uneven structure.

FIG. 11 shows an example in which the uneven structure is formed by a roll method. First, flexible metal is prepared as the metal layer 1. Metal sheet in a roll-shape or metal foil may be used. The metal layer 1 with a thickness, for example, from 10 μm to 100 μm can be used. Furthermore, a roller 61 provided on its surface with the nanoparticle arrangement structure 6 is arranged in a roll delivering apparatus. The method described in Embodiment 1 can be used to form the nanoparticle arrangement structure 6 on the surface of the roller 61. Specifically, the nanoparticle arrangement structure 6 can be formed by coating the surface of the roller 61 with the colloidal solution 60 in which the nanoparticles 6a such as the silica nanoparticles are dispersed. Alternatively, the nanoparticle arrangement structure 6 may be formed by winding the flexible substrate 5 on which the nanoparticle arrangement structure 6 is formed around the roller 61 in a roll-shape. The nanoparticle arrangement structure 6 is formed on the surface of the roller 61 by arranging the nanoparticles 6a in a curved-shape (cylindrical peripheral shape). A cylindrical mold constituted by the roller 61 is thus prepared.

Then, the metal layer 1 is delivered and the roller 61 rotating synchronously with the delivery speed thereof is pressed against the back surface of the metal layer 1 to form the uneven structure by causing the raised portions 1a to be raised in relief on the surface of the metal layer 1 by impressing the nanometal arranging structure 6 into the metal layer 1. At this time, if the metal layer 1 is pressed to the extent that it bends, there is sufficient pressing force and the raised portions 1a can be reliably formed.

Thereafter, the organic electroluminescence element of the embodiment as shown in FIG. 9 can be obtained by forming each layer of the organic layer 3 and the second electrode 4 by stacking these layers on the surface of the metal layer 1. This stacked formation can also be achieved with coating processes, with the coating processes being performed while the metal layer 1 serving as a substrate is delivered by the roll delivering apparatus as described in Embodiment 1. Therefore, it is possible to manufacture the organic electroluminescence element by a roll-to-roll method. Then, the raised portions are made gradually smaller in the order of the raised portion 2a of the first electrode 2, the raised portion 31a of the light-emitting layer 31 and the raised portion 32a of the hole transporting layer 32 and each interface can be made to have a flatter surface.

Figure 12:
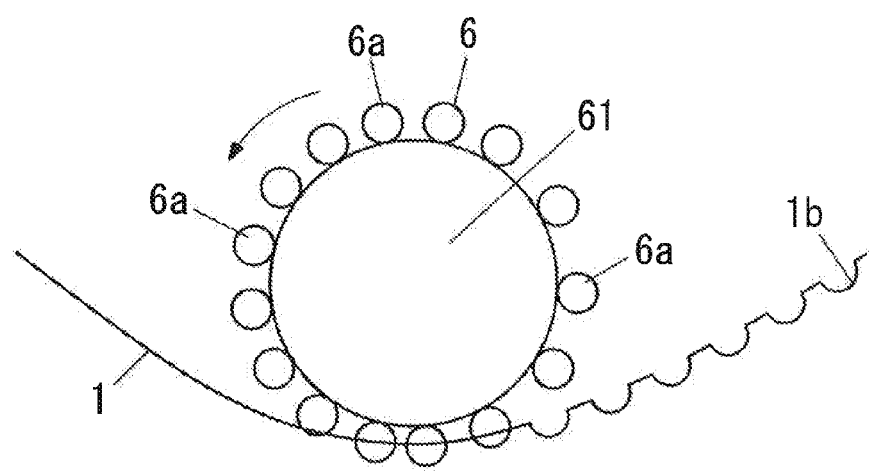
FIG. 12 is a schematic cross-sectional view showing other example of forming the uneven structure.

FIG. 12 shows another example in which the uneven structure is formed by a roll method. The roller 61 provided on its surface with the nanoparticle arrangement structure 6 is formed in the same manner as in the embodiment shown in FIG. 10.

Then, the metal layer 1 is delivered and the roller 61 rotating synchronously with the delivery speed thereof is pressed against the front surface of the metal layer 1 to form the uneven structure by recessing the recessed portions 1b on the surface of the metal layer 1 by impressing the nanometal arranging structure 6 into the metal layer 1. At this time, if the metal layer 1 is pressed to the extent that it bends, there is a sufficient pressing force and the recessed portions 1b can be reliably formed.

Thereafter, the organic electroluminescence element of the embodiment as shown in FIG. 10 can be obtained by forming each layer of the organic layer 3 and the second electrode 4 by stacking the layers on the surface of the metal layer 1. This stacked formation can also be achieved with coating processes while the metal layer 1 serving as a substrate is delivered by the roll delivering apparatus as described in Embodiment 1. Therefore, it is possible to manufacture the organic electroluminescence element by a roll-to-roll method. Then, the recessed portions are made to be gradually smaller in the order of the recessed portion 2b of the first electrode 2, the recessed portion 31b of the light-emitting layer 31 and the recessed portion 32b of the hole transporting layer 32 and an interface can be made to have a flatter surface.

Note that, in a roll method, a flat-plate mold (substrate 5) having the nanoparticle arrangement structure 6 is arranged on a roll delivering process and is pressed against the front surface or the back surface of the metal layer 1 to form the uneven structure by impressing the nanoparticle arrangement structure 6 into the flexible metal layer 1.

Since the uneven structure is formed on the surface of the metal layer 1 in the organic electroluminescence element shown in FIG. 9 and FIG. 10, it is possible to suppress the loss of light due to the surface plasmons generated on the metal surface and to improve the efficiency of light extraction to outside the element.

Embodiment 4

An organic electroluminescence element in which the insulating layer 7 and the first electrode 2 used in Embodiment 2 is stacked on the surface of the metal layer 1 used in the embodiment shown in FIG. 9 and each layer of the organic layer 3 and the second electrode 4 is further formed by being stacked thereon will be described as Embodiment 4.

Figure 13:
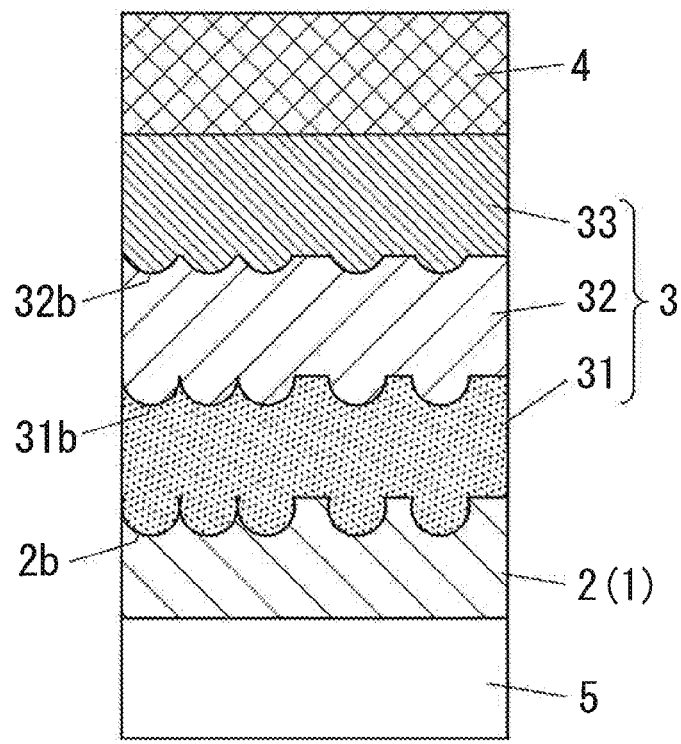
FIG. 13 is a schematic cross-sectional view showing another example of an embodiment of the organic electroluminescence element.

An embodiment in which the insulating layer 7, the first electrode 2, the organic layer 3 and the second electrode 4 are stacked on the surface of the metal layer 1 on which the raised portion 1a shown in FIG. 9 is formed is shown in FIG. 13. Note that at least one of the electron injection layer and the electron transporting layer may be provided between the first electrode 2 and the light-emitting layer 31. An embodiment in which the insulating layer 7, the first electrode 2, the organic layer 3 and the second electrode 4 are stacked on the surface of the metal layer 1 on which the recessed portion 1b shown in FIG. 10 is provided may be also configured similarly. An embodiment in which the first electrode 2 serves as the anode and the second electrode 4 serves as the cathode may be also configured similarly. The configurations described in Embodiments 1 to 3 can be adopted as the specific configurations of each layer. In FIG. 13, the same configurations as shown in FIG. 8 and FIG. 9 are denoted by the same reference numerals. In the present embodiment, it is also possible to suppress the loss of light due to the surface plasmons generated on the metal surface and to improve the efficiency of light extraction to outside the element.

Embodiment 5

An organic electroluminescence element in which a mold having the nanoparticle arrangement structure 6 as in the embodiment shown in FIG. 10 in Embodiment 3 is pressed against the surface of the metal layer 1 formed on the substrate 5 to form the uneven structure by recessing the recessed portions 2b on the surface of the metal layer 1 (second electrode 2) will be described as Embodiment 5.

Figure 14:
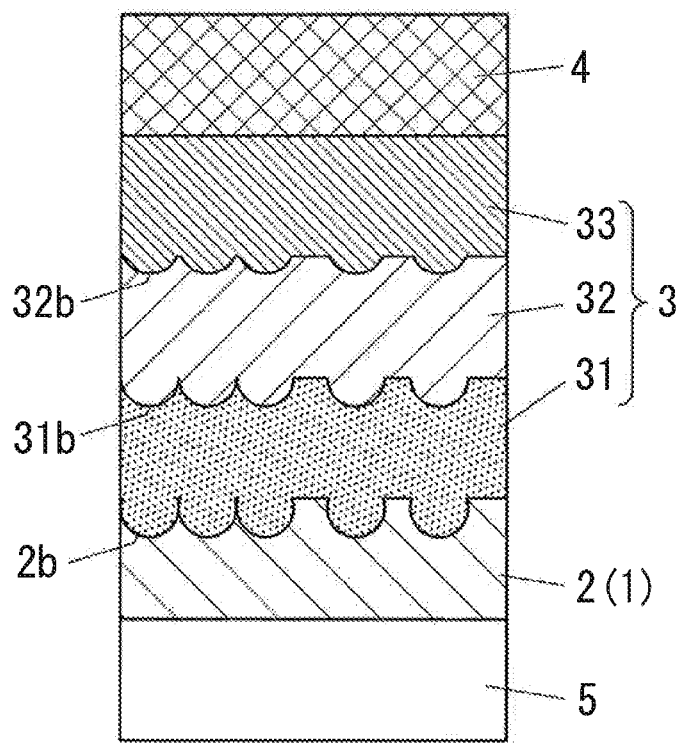
FIG. 14 is a schematic cross-sectional view showing another example of an embodiment of the organic electroluminescence element.

An embodiment in which the organic layer 3 and the second electrode 4 are formed on the uneven surface of the metal layer 1 (first electrode 2) is shown in FIG. 14. The mold having the nanoparticle arrangement structure 6 can be pressed against the metal layer 1 in the same manner as shown in FIG. 10. However, in the present embodiment, since the metal layer 1 absorbs the pressing force, raised portions are not formed on the metal layer 1 and the interface between the substrate 5 and the metal layer 1 is flat. Then, each layer of the organic layer 3 and the second electrode 4 are stacked on the surface on which the recessed portion 2b of the first electrode 2 is formed to make the size of the recessed portions on each layer gradually smaller, and it is possible to obtain the organic electroluminescence element having the configuration as shown in FIG. 14. Note that at least one of the electron injection layer and the electron transporting layer may be provided between the first electrode 2 and the light-emitting layer 31. An embodiment in which the insulating layer 7, the first electrode 2, the organic layer 3 and the second electrode 4 are stacked on the uneven surface of the metal layer 1 as in Embodiment 2 may be also configured similarly. In this case, an embodiment in which the first electrode 2 serves as the anode and the second electrode 4 serves as the cathode may be also configured similarly. The configurations described in Embodiments 1 to 3 can be adopted as the specific configurations of each layer. In FIG. 14, the same configurations as shown in FIG. 1 and FIG. 10 are denoted by the same reference numerals. In the present embodiment, it is also possible to suppress the loss of light due to the surface plasmons generated on the metal surface and to improve the efficiency of light extraction to the outside of the element.

In the organic electroluminescence element of each embodiment described above, since light striking the surface of the metal material is not easily lost as the surface plasmons and much of the light is reflected to the other side to be extracted to the outside of the element even if the metal material is used for at least one of the electrode layer and the light-reflecting layer, the light extraction efficiency is improved. Furthermore, the uneven structure of each interface between the plurality of layers of the organic layer 3 can be made smaller than that of the metal layer 2, and short circuits inside the element can be suppressed. Such an organic electroluminescence element can be applied to a lighting apparatus, backlights, displays and the like.

Note that the organic layer 3 include a plurality of layers need only be provided on the front surface side of the metal layer 1 on which the uneven structure having nano-order size is formed, and the present invention is not limited to the configurations described above. For example, a light extraction layer in which particles for improving the light extraction efficiency are dispersed may be formed in a light-extracting direction of the light-emitting layer 31.

EXAMPLES

Example 1

The organic electroluminescence element having the structure shown in FIG. 1 was manufactured. Note that a structure in which the silica nanoparticles are monodispersed and arranged randomly was used as the nanoparticle arrangement structure 6. A specific procedure will be shown hereinafter.

First, lysine (L-lysine) was dissolved in water as a basic amino acid, and an aqueous solution was prepared. Then, tetraethoxysilane (TEOS) was added to this solution of the basic amino acid and reacted by stirring at a rotating speed of 500 rpm in a water bath of 60° C. for 24 hours to produce a colloidal solution of silica. A molar ratio between raw materials was 1 (TEOS):154.4 ($H_2O$):0.02 (L-lysine). The silica nanoparticles having a particle diameter of about 15 nm were produced in the colloidal solution thus obtained.

Next, the block copolymer F127 shown in Chemical Formula 1 was added to the colloidal solution and completely dissolved in the colloidal solution by stirring at 60° C. for 24 hours. A ratio of the additive amount of F127 on the basis of the mass of silica in the colloidal solution was 1:1. Subsequently, the pH of the colloidal solution was adjusted to 8 using hydrochloric acid and the solution was left at rest at 60° C. for three days to be aged. This condition is for monodispersion as shown in FIG. 3. Then, this solution was diluted with four parts of water to obtain a coating material.

Next, this coating material was applied on and attached to a silicon substrate by dip coating. Subsequently, UV ozone treatment was performed under conditions of a wavelength of ultraviolet ray of 172 nm, a pressure of 50 Pa and an irradiation time of 30 minutes in order to remove the organic components (lysine and F127) of the coating material. The nanoparticle arrangement structure 6 having a monodispersed structure such as shown in FIG. 4 or FIG. 5 is probably formed by such treatment.

Figure 15:
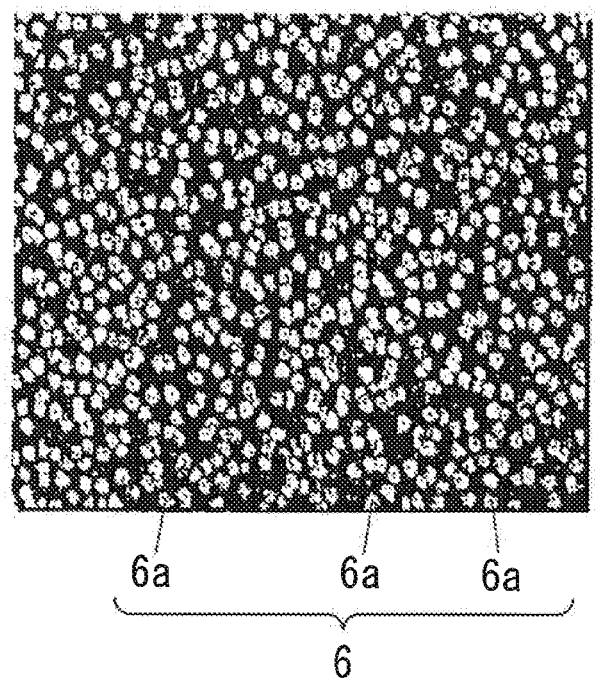
FIG. 15 is an SEM image showing an example of dispersion of nanoparticles.

FIG. 15 shows an SEM image of the surface of the substrate after the coating material treatment. This result confirms that the silica nanoparticles are not joined to each other on the substrate but are arranged in a dispersed state as seen in the SEM image. Furthermore, an alkali-free glass plate ("No. 1737" available from Corning Incorporated) with a thickness of 0.7 mm was used as the substrate 5 instead of the silicon substrate, the silica nanoparticles were similarly attached to the surface of the substrate 5, and the organic components were removed. This glass substrate to which the silica nanoparticles were attached was transparent when observed by the naked eye, and the haze was 0.08 and the transmittance was 91.9% when the haze and the total light transmittance were measured with a haze meter ("NDH2000" available from Nippon Denshoku Industries Co., Ltd.).

Next, aluminum was deposited as the metal layer 1 (first electrode 2) with a thickness of 80 nm on the surface of the glass substrate on which the nanoparticle arrangement structure 6 constituted by the silica nanoparticles was formed, and the cathode was obtained. Then, the uneven structure with a height of 15 nm and random pitches was formed when the surface of the first electrode 2 (cathode) was observed using an atomic force microscope (AFM).

Next, the light-emitting layer 31 was obtained by coating the first electrode 2 (cathode) with the solution in which a red polymer ("LightEmitting polymer ADS 111RE" available from American Dye Source, Inc.) was dissolved in a THF solvent such that the concentration was 1 wt % using a spin coater so that the film thickness was about 100 nm and by heating the resultant film at 100° C. for 10 minutes. Subsequently, the hole transporting layer 32 was obtained by coating the light-emitting layer 31 with the solution in which TFB (Poly[(9,9-dioctylfluorenyl-2,7-diyl)-co-(4,4'-(N-(4-sec-butylphenyl))diphenylamine)]) ("Hole Transport Polymer ADS 259 BE" available from American Dye Source, Inc.) was dissolved in a THF solvent such that the concentration was 1 wt % using a spin coater so that the film thickness was about 12 nm to produce a TFB film and by heating the TFB film at 200° C. for 10 minutes. The hole injecting layer 33 was obtained by coating this hole transporting layer 32 with the solution in which polyethylenedioxy thiophene/polystyrene sulfonate (PEDOT-PSS) ("Baytron PAI 4083" available from H. C. Starck-V Tech Ltd., PEDOT:PSS=1:6) and isopropyl alcohol were mixed such that the mixing ratio was 1:1 using a spin coater so that the film thickness of PEDOT-PSS was 30 nm and by heating the resultant film at 150° C. for 10 minutes. Moreover, the second electrode 4 (anode) was formed by pattern-forming the solution in which methyl cellulose (60 SH available from Shin-Etsu Chemical Co., Ltd.) was mixed with ITO nanoparticles (particle diameter of about 40 nm, ITCW 15 wt %-G30 available from C. I. Kasei Company, Limited) such that the concentration of the methyl cellulose was 5 wt % using a screen printing device so that the film thickness was about 300 nm on the hole injecting layer 33 and by drying the resultant film at 120° C. for 15 minutes. Thereby, the organic electroluminescence element was obtained.

Example 2

The organic electroluminescence element having the structure shown in FIG. 1 was manufactured. Note that a mesh structure in which the silica nanoparticles are linearly connected was used as the nanoparticle arrangement structure 6. A specific procedure will be shown hereinafter.

Lysine (L-lysine) was dissolved in water as a basic amino acid, and an aqueous solution was prepared. Then, tetraethoxysilane (TEOS) was added to this solution of the basic amino acid and reacted by stirring at a rotating speed of 500 rpm in a water bath of 60° C. for 24 hours to produce a colloidal solution of silica. A molar ratio between raw materials was 1 (TEOS):154.4 ($H_2O$):0.02 (L-lysine). The silica nanoparticles having a particle diameter of about 15 nm were produced in the colloidal solution thus obtained.

Next, the block copolymer F127 shown in Chemical Formula 1 was added to the colloidal solution and completely dissolved in the colloidal solution by stirring at 60° C. for 24 hours. A ratio of the additive amount of F127 on the basis of the mass of silica in the colloidal solution was set to 1:1. Subsequently, the pH of the colloidal solution was adjusted to 7 using hydrochloric acid and the solution was left at rest at 60° C. for three days to be aged. This is a condition for a linear connection such as shown in FIG. 6. Then, this solution was diluted with four parts of water to obtain a coating material.

Next, this coating material was coated on and attached to a silicon substrate by dip coating. Subsequently, UV ozone treatment was performed under conditions of a wavelength of ultraviolet ray of 172 nm, a pressure of 50 Pa and an irradiation time of 30 minutes in order to remove the organic components (lysine and F127) of the coating material. The nanoparticle arrangement structure 6 having a mesh structure such as shown in FIG. 7 is probably formed by such treatment.

Figure 16:
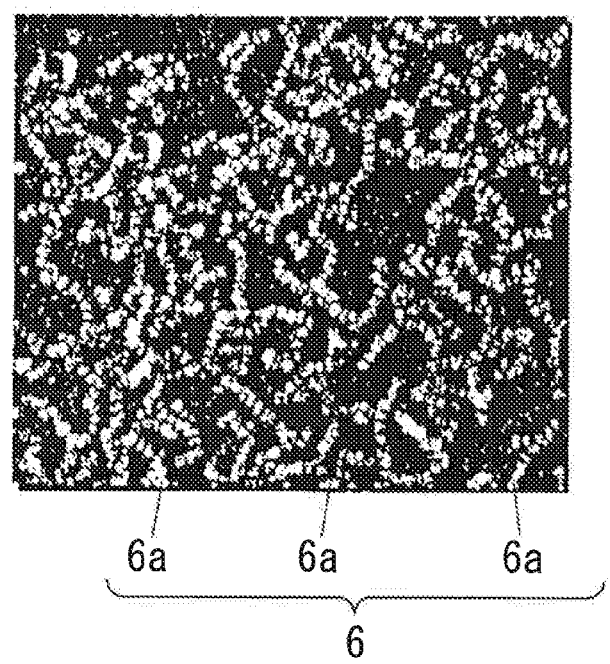
FIG. 16 is an SEM image showing another example of dispersion of nanoparticles.

FIG. 16 shows an SEM image of the surface of the substrate after the coating material treatment. This result confirms that the silica nanoparticles are connected to each other in several to several tens thereof to form a mesh structure on the surface of the substrate and the nanoparticle arrangement structure 6 is formed on the surface of the substrate as seen in the SEM image. Furthermore, an alkali-free glass plate ("No. 1737" available from Corning Incorporated) with a thickness of 0.7 mm was used as the substrate 5 instead of the silicon substrate, the silica nanoparticles were similarly attached to the surface of the substrate 5, and the organic components were removed. This glass substrate to which the silica nanoparticles were attached was transparent when observed by the naked eye, and the haze was 0.09 and the transmittance was 91.8% when the haze and the total light transmittance were measured with a haze meter ("NDH2000" available from Nippon Denshoku Industries Co., Ltd.).

Then, the first electrode 2 (metal layer 1) was formed in the same manner as in Example 1 on the surface of the glass substrate on which the nanoparticle arrangement structure 6 constituted by the silica nanoparticles was formed. The uneven structure with a height of 15 nm and a mesh-shape was formed when the surface of the first electrode 2 (cathode) was observed using an atomic force microscope (AFM). Moreover, the light-emitting layer 31, the hole transporting layer 32, the hole injecting layer 33 and the second electrode 4 were stacked on the first electrode 2 in the same manner as in Example 1. Thereby, the organic electroluminescence element was obtained.

Example 3

The organic electroluminescence element having the structure shown in FIG. 8 was manufactured. A specific procedure will be shown hereinafter.

By the same method as in Example 1, the silica nanoparticles were used to form the fine uneven structure with a height of 15 nm and random pitches on the substrate 5, and the metal layer 1 was formed as a reflecting layer by depositing aluminum with a thickness of 80 nm by vapor deposition on the surface of the substrate 5 on which this uneven structure was formed. The uneven structure with a height of 15 nm and random pitches was formed when the surface of the metal layer 1 was observed using an atomic force microscope (AFM). Next, the insulating layer 7 was formed by coating the metal layer 1 with PMMA with a thickness of 100 nm and by curing the resultant film. Moreover, a layer of IZO with a thickness of 100 nm was formed on that layer by sputtering to obtain the first electrode 2 (cathode). The light-emitting layer 31, the hole transporting layer 32, the hole injecting layer 33 and the second electrode 4 were stacked thereon by the same method as in Example 1. Thereby, the organic electroluminescence element was obtained.

Example 4

The organic electroluminescence element having the structure shown in FIG. 9 was manufactured. A specific procedure will be shown hereinafter.

Aluminum foil (thickness of about 30 μm) was prepared as the metal layer 1 (substrate). The substrate 5 having the nanoparticle arrangement structure 6 produced in the same manner as in Example 1 was pressed as a mold against the opposite surface of this aluminum foil to the surface which was coated with the organic layer 3. Thereby, the fine uneven structure was formed on the aluminum foil by impressing the nanoparticle arrangement structure 6 into the aluminum foil. The uneven structure with a height of 15 nm and random pitches was formed when the surface of the aluminum foil (cathode) was observed using an atomic force microscope (AFM). Then, the light-emitting layer 31 was formed on this aluminum foil by the same method as in Example 1. The hole transporting layer 32, the hole injecting layer 33 and the second electrode 4 were stacked on that layer by the same method as in Example 1. Thereby, the organic electroluminescence element was obtained.

Comparative Example 1

An alkali-free glass plate (No. 1737 available from Corning Incorporated) with the thickness of 0.7 mm was used as the substrate to form the first electrode 2 (cathode) by depositing aluminum with a thickness of 80 nm on the substrate by a vapor deposition method without forming the fine uneven structure. Otherwise, the light-emitting layer 31, the hole transporting layer 32, the hole injecting layer 33 and the second electrode 4 (anode) were stacked in the same manner as in Example 1. Thereby, the organic electroluminescence element having a structure for comparison with Examples 1 and 2 was produced.

Comparative Example 2

An alkali-free glass plate (No. 1737 available from Corning Incorporated) with the thickness of 0.7 mm was used as the substrate to form the metal layer 1 (reflecting layer) by depositing aluminum with a thickness of 80 nm on the substrate by a vapor deposition method without forming the fine uneven structure. Otherwise, the insulating layer 7, the first electrode 2, the light-emitting layer 31, the hole transporting layer 32, the hole injecting layer 33 and the second electrode 4 (anode) were stacked in the same manner as in Example 3. Thereby, the organic electroluminescence element having a structure for comparison with Example 3 was produced.

Comparative Example 3

Aluminum foil (thickness of 30 μm) was used as the substrate to form the light-emitting layer 31 in the same manner as in Example 1 on the flat surface without pressing the mold thereon. Otherwise, the hole transporting layer 32, the hole injecting layer 33 and the second electrode 4 were stacked in the same manner as in Example 1. Thereby, the organic electroluminescence element having a structure for comparison with Example 4 was produced.

(Evaluation)

A current was passed between the electrodes of each organic electroluminescence element of the examples and the comparative examples such that a current density was 10 mA/cm², and light emitted into the air was measured using an integrating sphere. Then, external quantum efficiency of the light emitted into the air was calculated on the basis of these measurement results. External quantum efficiency is a rate of the number of radiated photons to the number of electrons that are injected to the light-emitting layer 31 and recombined, and the external quantum efficiency of the light emitted into the air is calculated from the current applied to the organic electroluminescence element and the amount of the light emitted into the air.

The rates of external quantum efficiency of Examples 1 and 2 to that of Comparative Example 1, the rate of external quantum efficiency of Example 3 to that of Comparative Example 2 and the rate of external quantum efficiency of Example 4 to that of Comparative Example 3 are shown in Table 1.

Table 1 shows that Examples 1 to 4 have excellent rates of external quantum efficiency compared with the corresponding comparative examples to which the layer configurations of the examples correspond. Furthermore, when a voltage of 2 V is applied, the current values are almost equal in the respective comparisons of Examples 1 and 2 with Comparative Example 1, Example 3 with Comparative Example 2, and Example 4 with Comparative Example 3. Therefore, this result confirms that short circuits are suppressed in Examples 1 to 4 irrespective of the uneven structure being formed on the surface of the metal layer 1.

As described above, it is possible to suppress the loss of light due to the surface plasmons by converting the surface plasmons generated on the surface of the metal layer 1 to light to be transmitted, while also making the uneven structure of an interface in the organic layer 3 small and being able to suppress short circuits, by forming the uneven structure having the nano-order size on one side of the metal layer 1 using the nanoparticle arrangement structure 6 and by stacking the organic layer 3 and the like thereon.

TABLE 1

|  | Structure on first electrode | Rate of external quantum efficiency at 10 mA/cm² | Current value (mA) at 2 V |
|---|---|---|---|
| Example 1 | Glass substrate/ uneven structure/ Al (uneven) | 1.27 | $4.0 \times 10^{-7}$ |
| Example 2 | Glass substrate/ uneven structure/ Al (uneven) | 1.25 | $4.1 \times 10^{-7}$ |
| Comparative Example 1 | Glass substrate/ uneven structure/ Al (flat) | 1.00 | $3.6 \times 10^{-7}$ |
| Example 3 | Glass substrate/ uneven structure/ Al (uneven)/ PMMA/IZO | 1.23 | $3.8 \times 10^{-7}$ |
| Comparative Example 2 | Glass substrate/ uneven structure/ Al (flat)/PMMA/ IZO | 1.00 | $3.9 \times 10^{-7}$ |
| Example 4 | Metal foil (uneven) | 1.32 | $6.1 \times 10^{-7}$ |
| Comparative Example 3 | Metal foil (flat) | 1.00 | $6.0 \times 10^{-7}$ |

REFERENCE SIGNS LIST

1 Metal layer
2 First electrode
3 Organic layer
31 Light-emitting layer
32 Hole transporting layer
33 Hole injecting layer
4 Second electrode
5 Substrate
6 Nanoparticle arrangement structure
6a Nanoparticle
7 Insulating layer
1a, 2a, 31a, 32a Raised portion
1b, 2b, 31b, 32b Recessed portion

The invention claimed is:

1. An organic electroluminescence element comprising:
   a metal layer provided on its surface with a nanosize uneven structure by a nanoparticle arrangement structure in which nanoparticles are arranged in a planar fashion;
   an organic layer disposed on an uneven surface of the metal layer and constituted by a plurality of layers including a light-emitting layer; and
   an electrode formed on an opposite side of the organic layer to the metal layer,
   wherein each interface between the plurality of layers of the organic layer is flatter than the uneven surface of the metal layer; and
   an interface between the organic layer and the electrode is flat.

2. The organic electroluminescence element according to claim 1, wherein
   the electrode serves as a second electrode; and
   the metal layer is formed on a surface of a substrate having the nanoparticle arrangement structure, and serves as a first electrode.

3. The organic electroluminescence element according to claim 1, wherein:
   the electrode serves as a second electrode;
   the metal layer is formed on a surface of a substrate having the nanoparticle arrangement structure; and
   an insulating layer and a first electrode are stacked in this order on the surface of the metal layer.

4. The organic electroluminescence element according to claim 1, wherein:
   the uneven structure of the metal layer is formed by impressing the nanoparticle arrangement structure into the metal layer; and
   the metal layer serves as a substrate on which the organic layer is stacked.

5. The organic electroluminescence element according to claim 1, wherein
   the nanoparticle arrangement structure is a structure in which the nanoparticles are monodispersed.

6. The organic electroluminescence element according to claim 1, wherein the nanoparticle arrangement structure is a structure in which the nanoparticles are randomly arranged.

7. The organic electroluminescence element according to claim 1, wherein
the nanoparticle arrangement structure is a mesh structure formed by linearly connecting silica nanoparticles.

8. The organic electroluminescence element according to claim 1, wherein
uneven structures of the interfaces between the plurality of layers of the organic layer are smaller in height as the interfaces get closer to the electrode.

9. The organic electroluminescence element according to claim 1, wherein
all of the interfaces in the organic layer are flat.

* * * * *